United States Patent [19]

Willey et al.

[11] Patent Number: 5,034,968

[45] Date of Patent: Jul. 23, 1991

[54] ALGORITHMIC DATA COMPRESSION

[76] Inventors: Gene Willey, 423 Cherokee St., Kechi, Kans. 67067; John Wakefield, 402 Oak Grove Ave. #K, Menlo Park, Calif. 94025; Chris Radcliffe, 3654 Farm Hill Blvd., Redwood City, Calif. 94061

[21] Appl. No.: 375,336

[22] Filed: Jul. 3, 1989

[51] Int. Cl.$^5$ .............................................. H04B 1/66
[52] U.S. Cl. .................................... 375/122; 358/433; 364/715.02
[58] Field of Search .................... 375/27, 122; 382/41, 382/56; 358/133, 135, 433, 448, 426; 381/34; 370/109; 364/715.02

[56] References Cited

U.S. PATENT DOCUMENTS

| | | | |
|---|---|---|---|
| 4,204,227 | 5/1980 | Gurley | 358/133 |
| 4,222,076 | 9/1980 | Knowlton | 358/433 |
| 4,768,082 | 8/1988 | Hiratsuka et al. | 356/433 |
| 4,772,956 | 9/1988 | Roche et al. | 358/133 |
| 4,821,119 | 4/1989 | Gharaui | 375/122 |
| 4,849,812 | 7/1989 | Borgers et al. | 375/27 |

Primary Examiner—Douglas W. Olms
Assistant Examiner—Stephen Chin
Attorney, Agent, or Firm—Limbach, Limbach & Sutton

[57] ABSTRACT

The present invention is for an algorithmic method for compressing data. The data is compressed one cycle at a time and stores a data block each cycle. The method includes the steps of forming a storage array of binary bits. The array has a first plurality of columns, a second plurality of rows, a third plurality of right diagonals and a fourth plurality of left diagonals. In the preferred embodiment the array has 30 rows, 30 columns, 59 left diagonals and 59 right diagonals. The array also has a data entry site. The array is also segmented into a plurality of morsels each comprising a collection of a binary bits. A new data block is entered into the data entry site. A fifth plurality of sums is formed representing the sum of binary 1's in each column, each row, each right diagonal and each left diagonal. Each sum is right diagonal and each left diagonal. Each sum is stored into a morsel thereby forming a summation array. Each summation array contains sufficient information to decompress the parent array and a compressed bit of information.

8 Claims, 25 Drawing Sheets

HORIZONTAL   VERTICAL   LEFT DIAGONAL   RIGHT DIAGONAL

ALGORITHMIC DATA COMPRESSION

FIELD OF THE INVENTION

This invention relates to the field of data compression. More particularly, this invention relates to the field of compressing a stream of data utilizing a compression algorithm.

BACKGROUND OF THE INVENTION

Storage of binary information is necessary for most applications utilizing digital computers. Binary data is typically stored in semiconductor RAM and ROM, as optical data on CDROM, as punched holes on paper tape and cards and as magnetic data on tape, hard disks and floppy discs and bubble memory. Storage of such data can be expensive in terms of hardware or labor to load mass storage media.

To decrease the cost of storing binary information compression algorithms have been utilized to increase the density of stored binary bits. Such methods include hierarchal trees and look up tables. However, such methods of storing binary information are limited in the density of information which can be stored. What is needed are increasingly efficient compression algorithms for binary data storage.

SUMMARY OF THE INVENTION

The present invention is for an algorithmic method for compressing data. The data is compressed by a computer, one cycle at a time and stores a data block each cycle. The method includes the steps of forming a storage array of binary bits. The array has a first plurality of columns, a second plurality of rows, a third plurality of right diagonals and a fourth plurality of left diagonals. In the preferred embodiment the array has 30 rows, 30 columns, 59 left diagonals and 59 right diagonals. The array also has a data entry site. The array is also segmented into a plurality of morsels each comprising a collection of binary bits.

A new data block is entered into the data entry site. A fifth plurality of sums is formed representing the sum of binary 1's in each column, each row, each right diagonal and each left diagonal. Each sum is stored into a morsel thereby forming a summation array.

BRIEF DESCRIPTION OF THE DRAWINGS

FIG. 1D shows the 59 right diagonals of a data array according to the preferred embodiment of the present invention.

FIG. 2 shows a blank summation vector according to the preferred embodiment of the present invention.

FIGS. 4A through 4J show the sequence of compression arrays and summation vectors for compressing a given sequence of bits.

FIGS. 5A through 5E show the sequence of decompression.

DETAILED DESCRIPTION OF THE PREFERRED EMBODIMENT

The invention will be described relative to a preferred embodiment. However, it will be apparent that arrays and integers of different numbers of bits can be used.

According to the preferred embodiment, one bit is stored or decoded per operation of the algorithm. A stream of binary bits is stored through operation of the algorithm into an array.

Figure 1A:
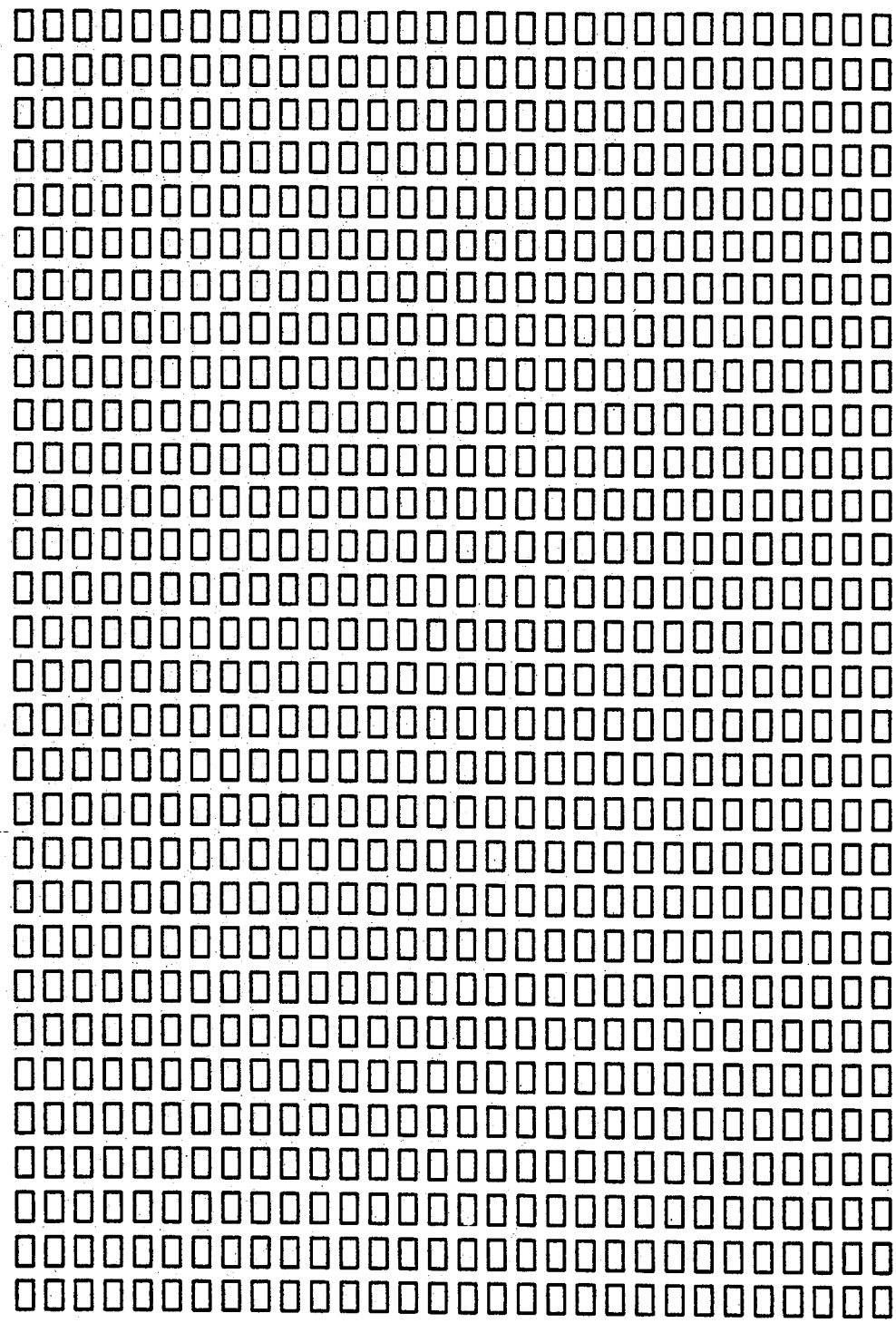
FIG. 1A shows a blank data array according to the preferred embodiment of the present invention.
Figure 1B:
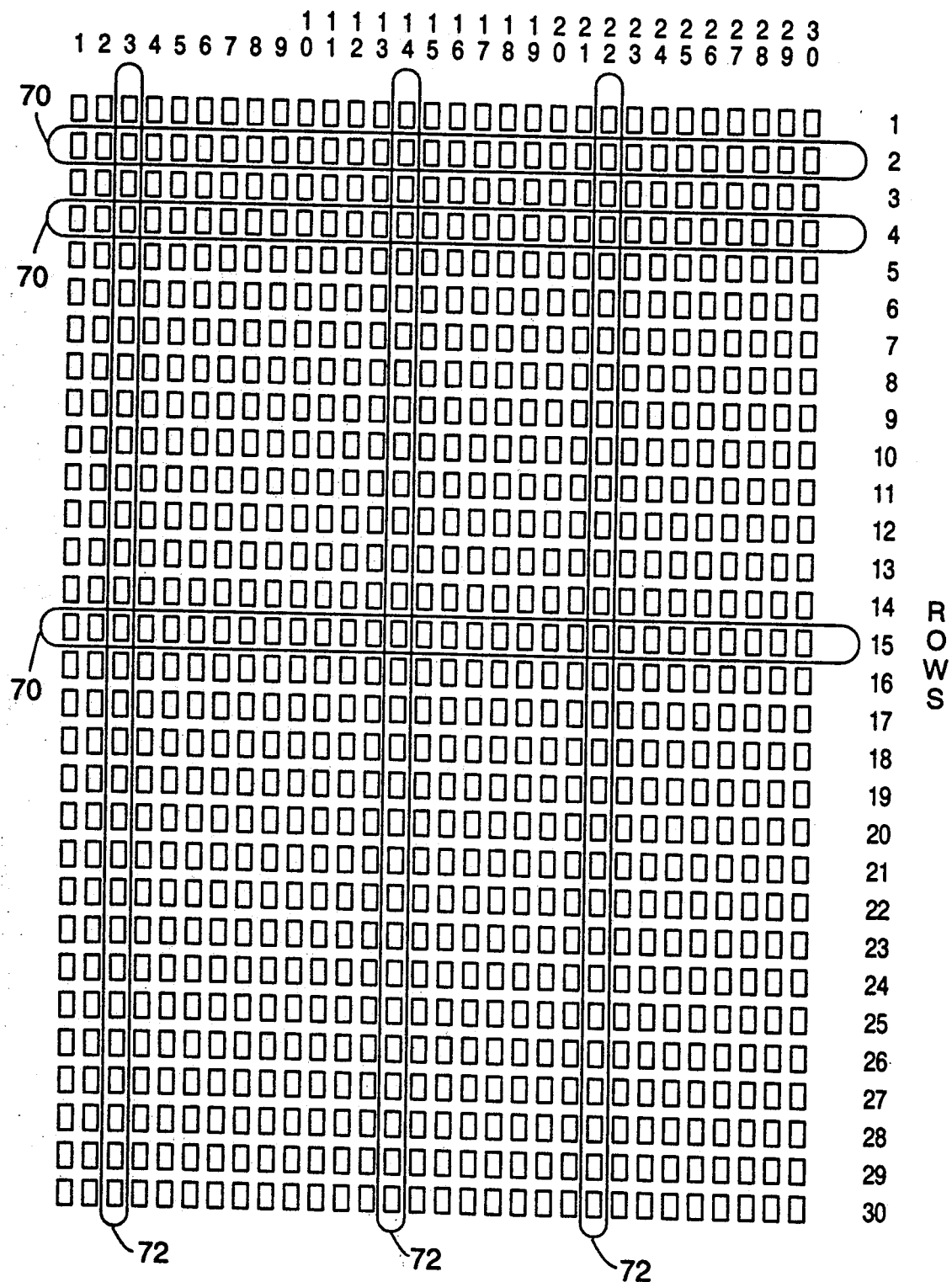
FIG. 1B shows the 30 rows and 30 columns of a data array according to the preferred embodiment of the present invention.

FIG. 1A shows the array of the preferred embodiment of the present invention. The array is shown as a square array which has 30×30 elements. In the preferred embodiment, each element is a binary bit. FIG. 1B shows that the array has 30 rows (horizontal members) and 30 columns (vertical members). Several of the rows 70 and several of the columns 72 are indicated in FIG. 1B. The rows are counted from the top of the are counted from the left to the right from 1 through 30 as shown.

Figure 1C:
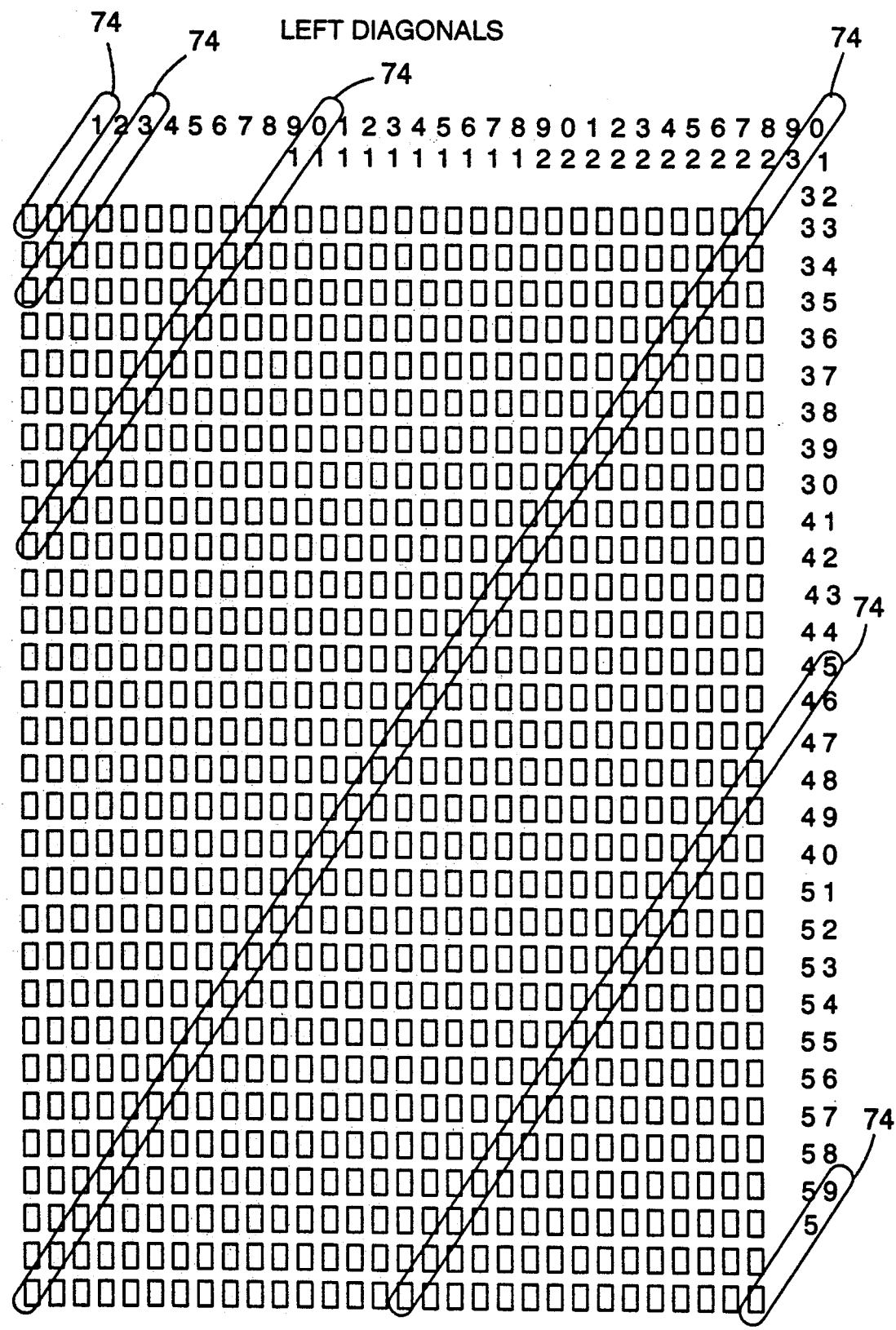
FIG. 1C shows the 59 left diagonals of a data array according to the preferred embodiment of the present invention.

FIG. 1C shows that there are 59 left diagonals. The left diagonals vary in length. The shortest contains a single element and the longest contains 30 elements. There are two left diagonals which contain 1 through 29 elements and one which contains 30 elements. The left diagonals are counted from the upper left hand of the array as shown. Left diagonal number 1 contains a single element. Left diagonal number 30 is the longest left diagonal beginning at the lower left hand corner and terminating at the upper right hand corner as shown. Several of the left diagonals 74 are indicated in FIG. 1C.

FIG. 1D shows that there are 59 right diagonals. The right diagonals also vary in length. The shortest contains a single element and the longest contains 30 elements. There are two right diagonals which contain 1 through 29 elements and one which contains 30 elements. The right diagonals are counted from the lower left hand of the array as shown. Right diagonal number 1 contains a single element. Right diagonal number 30 is the longest right diagonal beginning at the upper left hand corner and terminating at the lower right hand corner as shown. Several of the left diagonals 76 are indicated in FIG. 1D.

Figure 2:
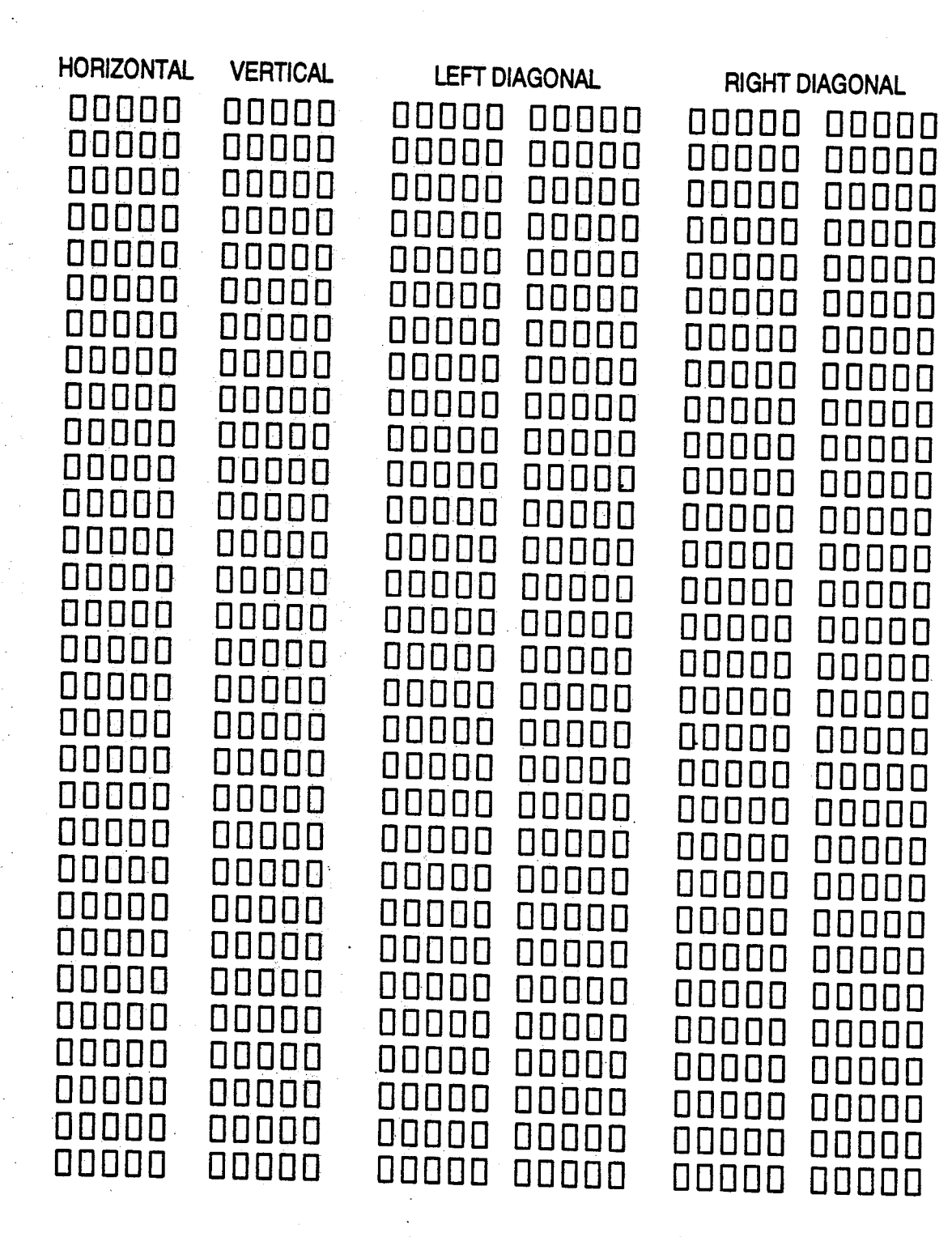

FIG. 2 shows a blank summation vector. The summation vector contains 180 5 bit morsels. These morsels are arranged in 6 columns of 30 morsels each. As will be described below, the left-most column of morsels relates to the horizontal rows of the array. The next column of morsels relates to the vertical columns of the array. The next two columns of morsels relate to the left diagonals of the array. The last two columns of morsels relate to the right diagonals of the array.

The first morsel in the first column of morsels of a summation vector represents the binary sum of all of the binary 1's in the first horizontal row. There is one morsel in the first column of the summation vector for every row in an array.

Because there are 30 bits in the first row there can be any number from 0 to 30 of binary 1s in that row. A five digit binary number, like the morsel of the present invention, can represent any number from 0 through 31. Thus, the five binary digit morsels of the present invention are sufficiently large to represent any possible number of elements in any row of an array.

Similarly, the first morsel in the second column of morsels of the summation vector represents the binary sum of all of the binary 1's in the first vertical column. There is one morsel in the second column of the summation vector for every column in the array.

There are 59 left diagonals. The third column of morsels in the summation vector represent the binary sum of left diagonals 1 through 30. The fourth column of morsels in the summation vector represent the binary sum of left diagonals 31 through 59. There is one extra morsel left over at the bottom the fourth column.

There are 59 right diagonals. The fifth column of morsels in the summation vector represent the binary sum of right diagonals 1 through 30. The sixth column of morsels in the summation vector represent the binary sum of right diagonals 31 through 59. There is one extra morsel left over at the bottom the sixth column. Accordingly, each summation vector contain sufficient information to reconstruct its parent vector.

Figure 3A:
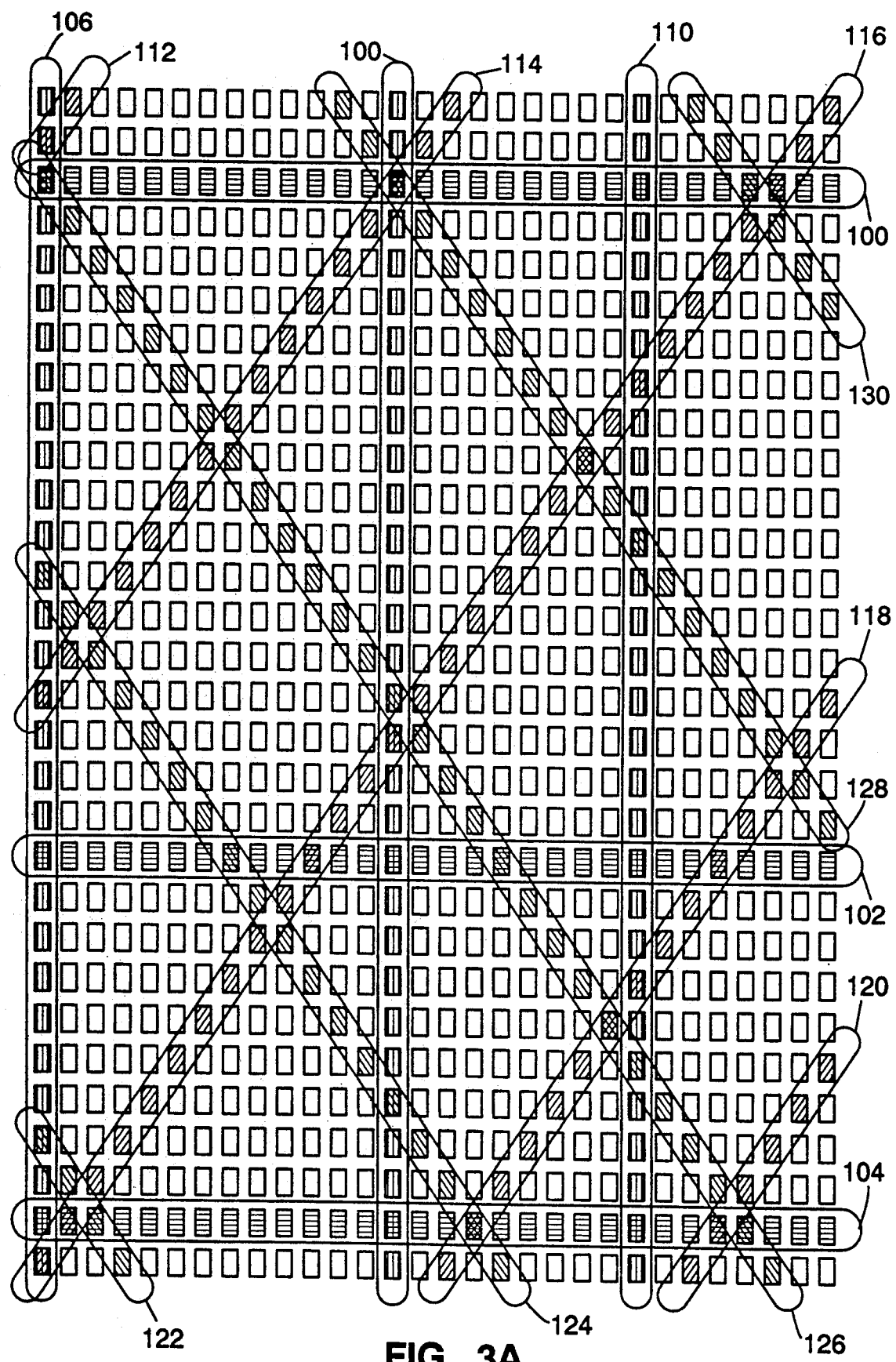
FIGS. 3A and 3B show the relationship between the rows, columns, left diagonals and right diagonals in a data array and their appropriate morsels in a summation vector.
Figure 3B:
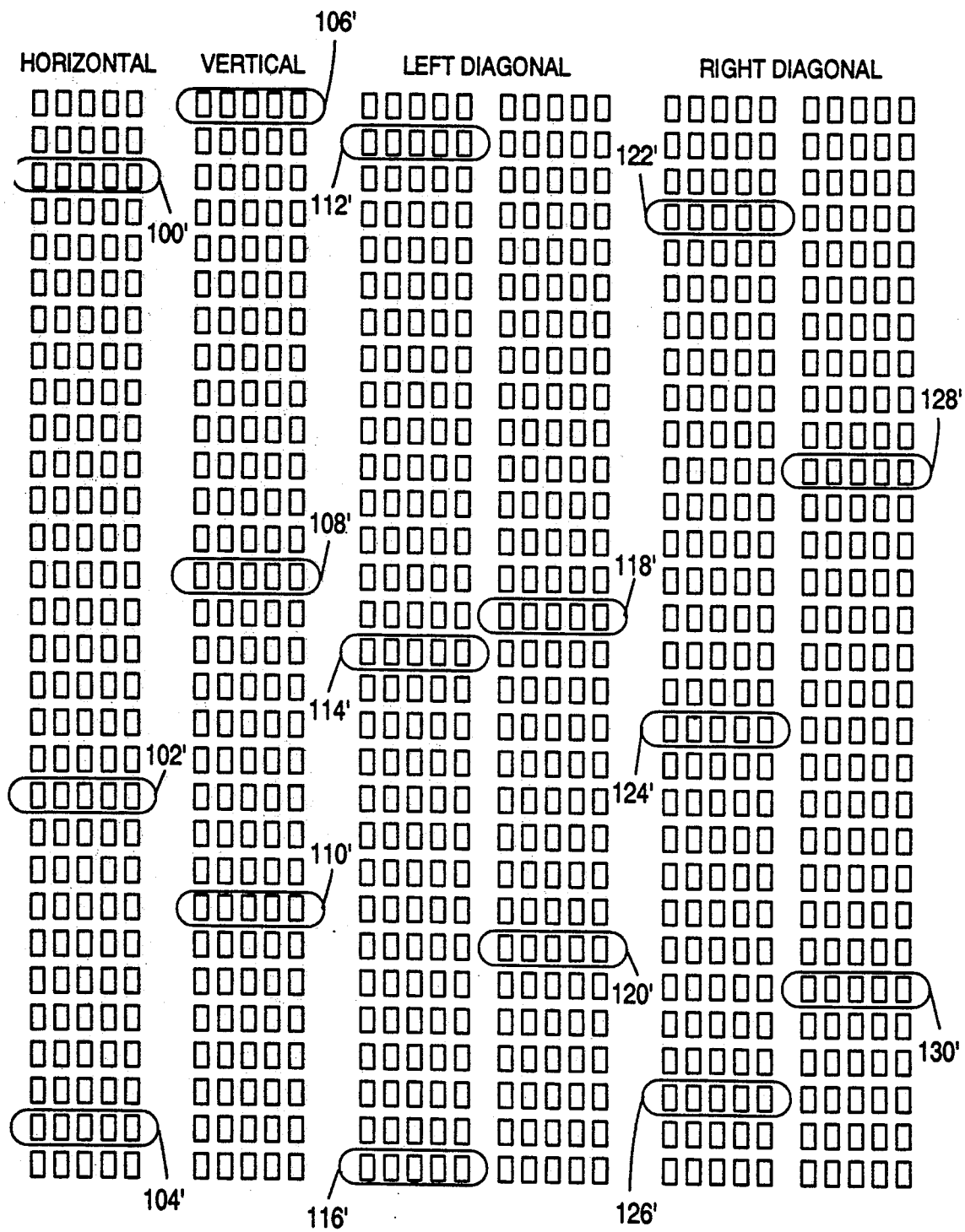

FIG. 3A identifies three specific rows 100, 102 and 104, three specific columns 106, 108 and 110, five specific left diagonals, 112, 114, 116, 118 and 120 and five specific right diagonals 122, 124, 126, 128 and 130 of an array. FIG. 3B shows the corresponding morsels for these rows, columns and diagonals 100' through 130', respectively.

The compression algorithm of the present invention provides for the compression of a stream of bits. One bit is compressed at a time. The example shown in FIG. 4A through 4J shows the sequence of events to compress the binary stream 101 using the present invention.

Figure 4A:
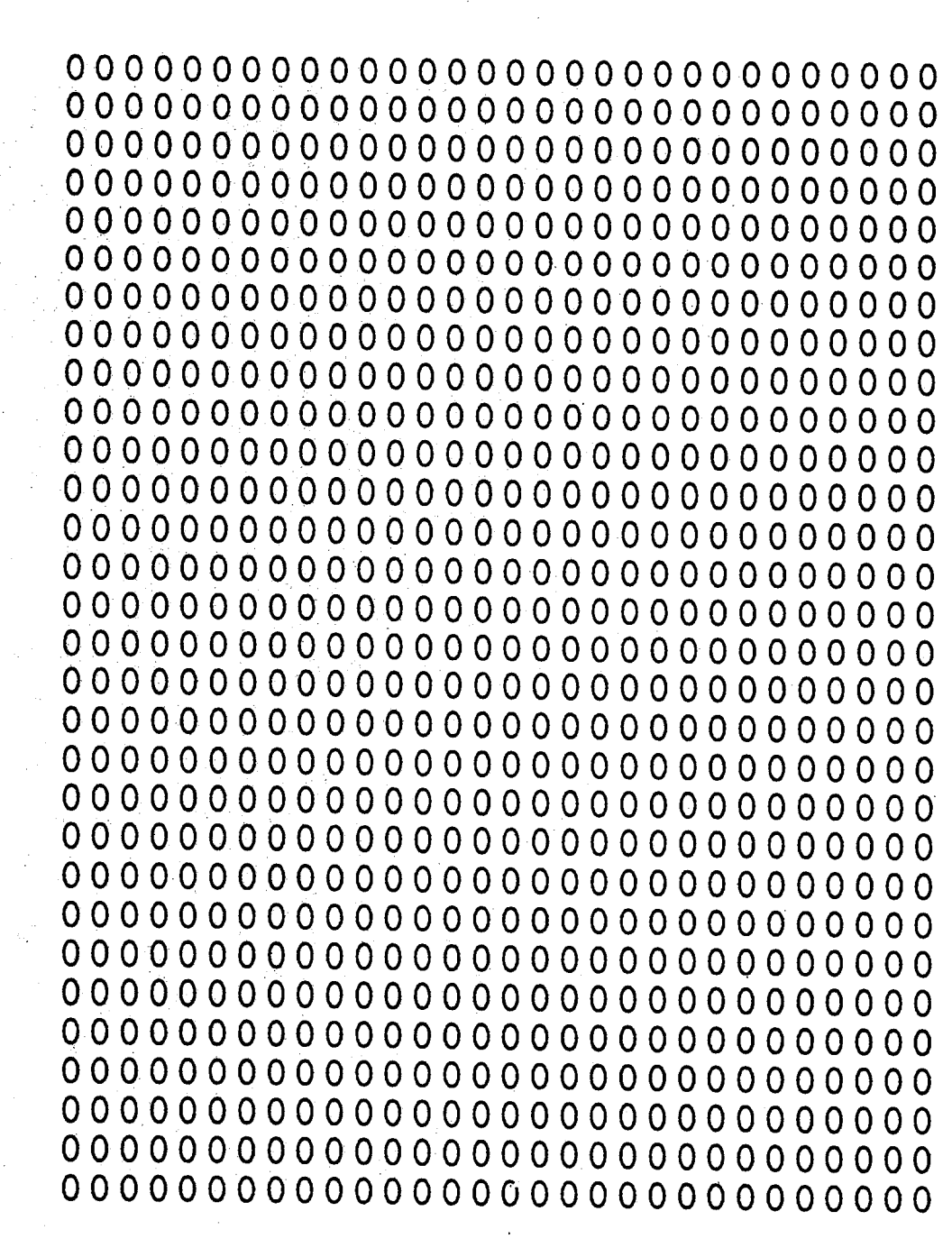
Figure 4B:
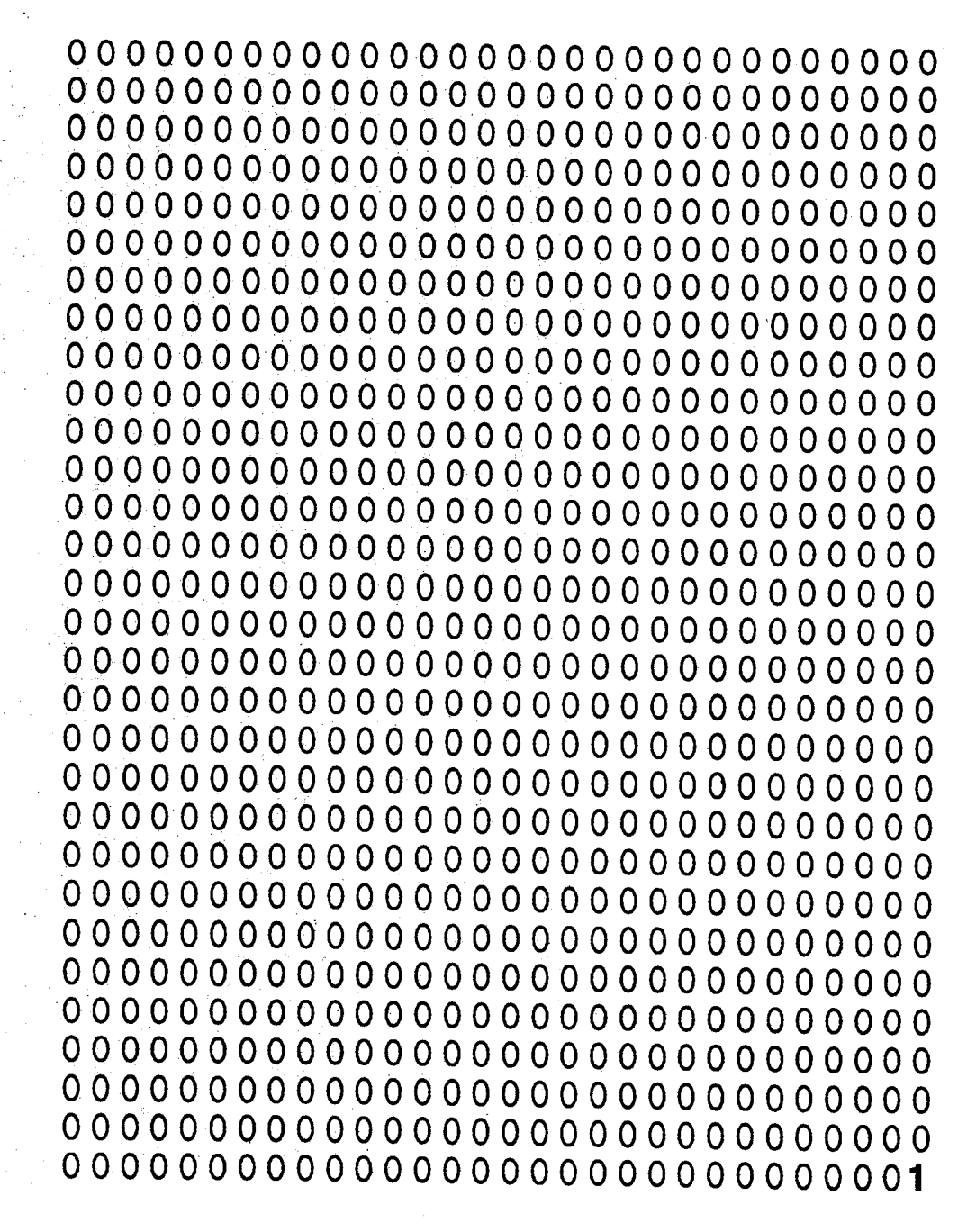
Figure 4C:
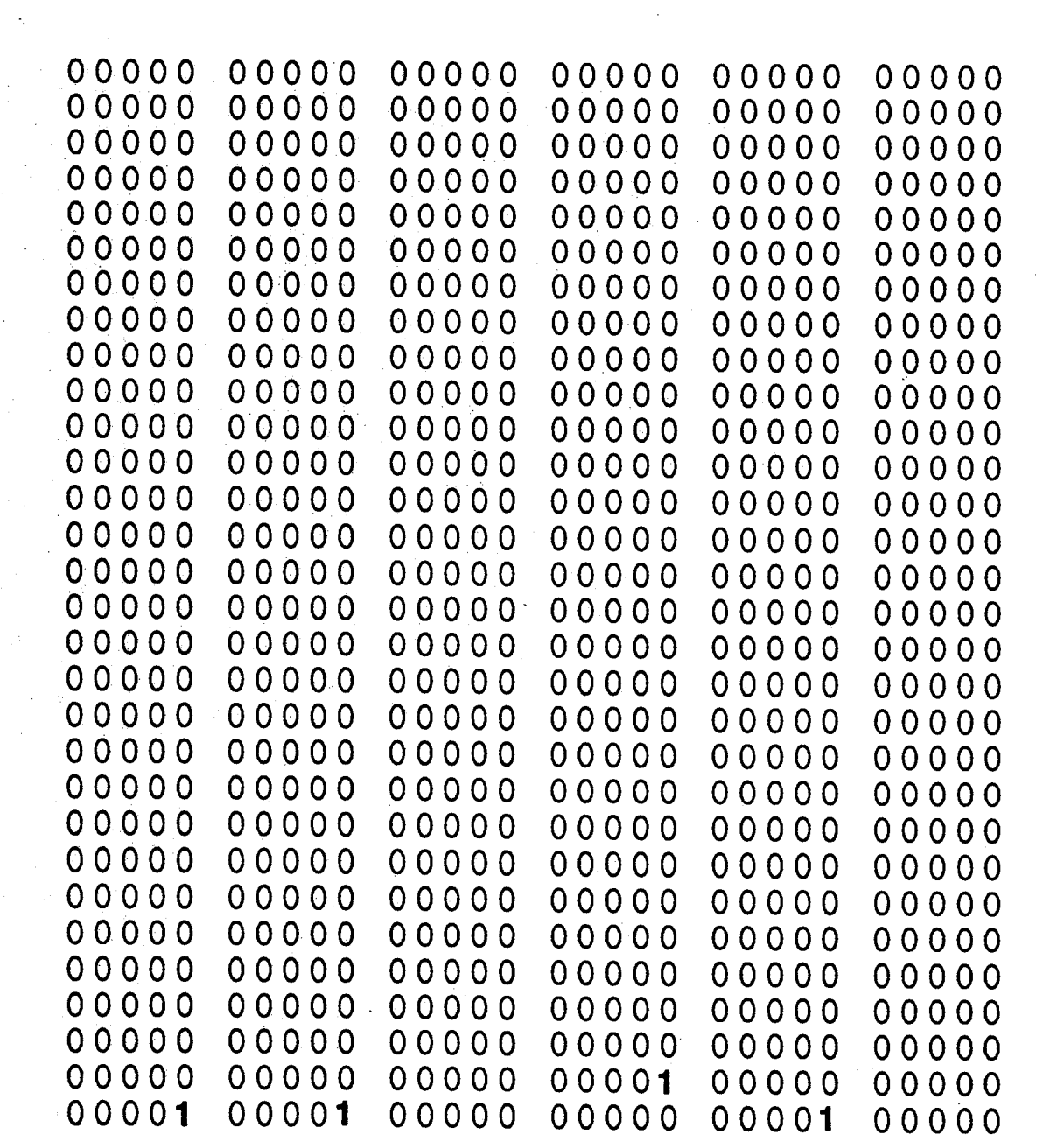

The first array is preferably the null vector shown in FIG. 4A. The first non-0 bit is loaded into the last position in the array as shown in FIG. 4B. The array is then operated on in order to formulate a plurality binary sums for the number of 1's in each of the rows, columns, left diagonals and right diagonals. Each of these sums is entered into its appropriate five-bit morsel in the next summation vector. FIG. 4C is the summation vector for the array of FIG. 4B. In other words, the first five bit morsel in the first column of morsels is the binary sum of the 1's in the first row of the array of FIG. 4B and so on.

Figure 4D:
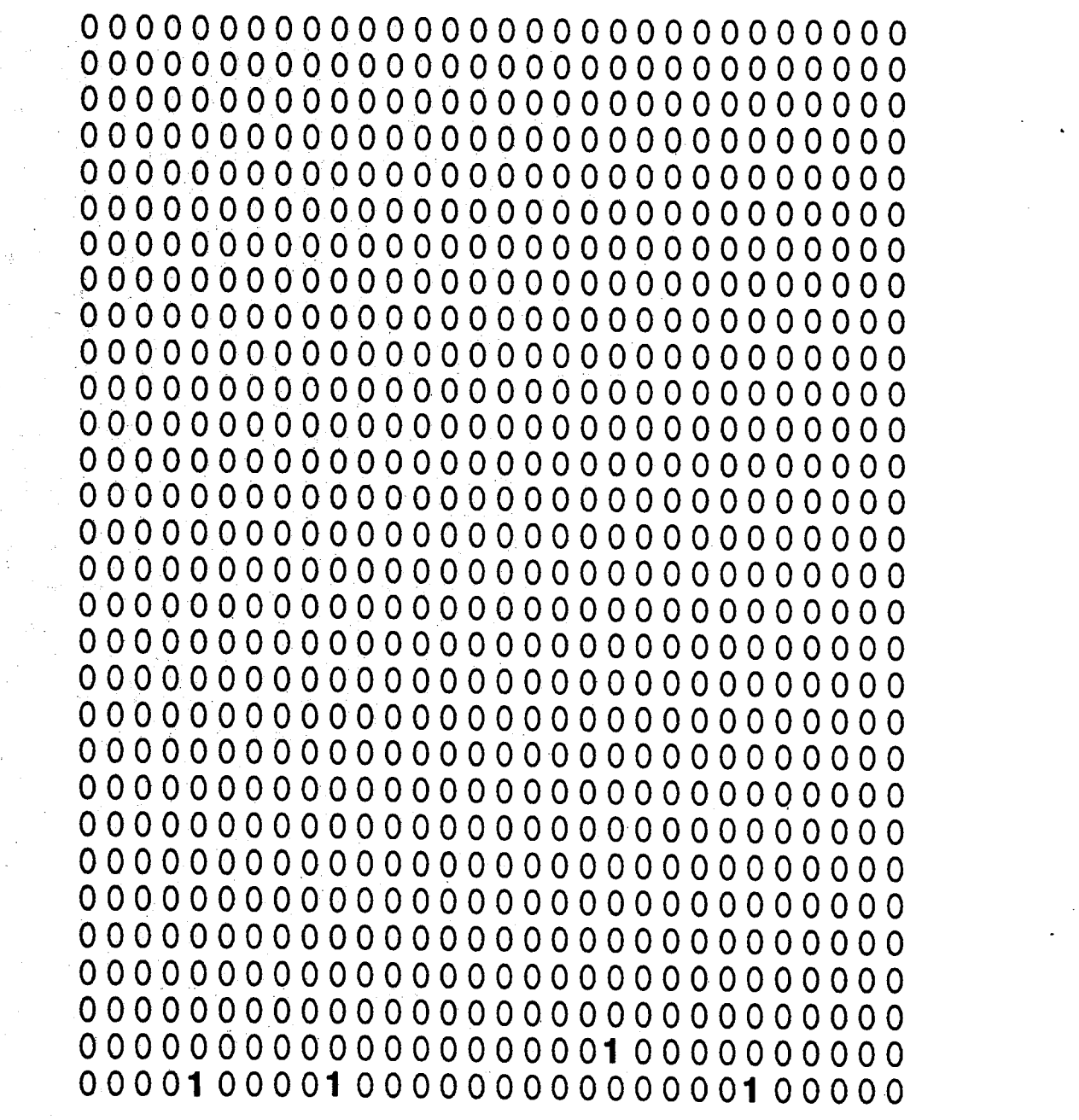

The array of FIG. 4D contains the identical information as the summation vector of FIG. 4C. In actual practice, a digital computer will be employed to carry out these operations and thus, the summation vectors of FIG. 4C, 4F and 4I will not be formed. These summation vectors are merely included to facilitate understanding.

Figure 4E:
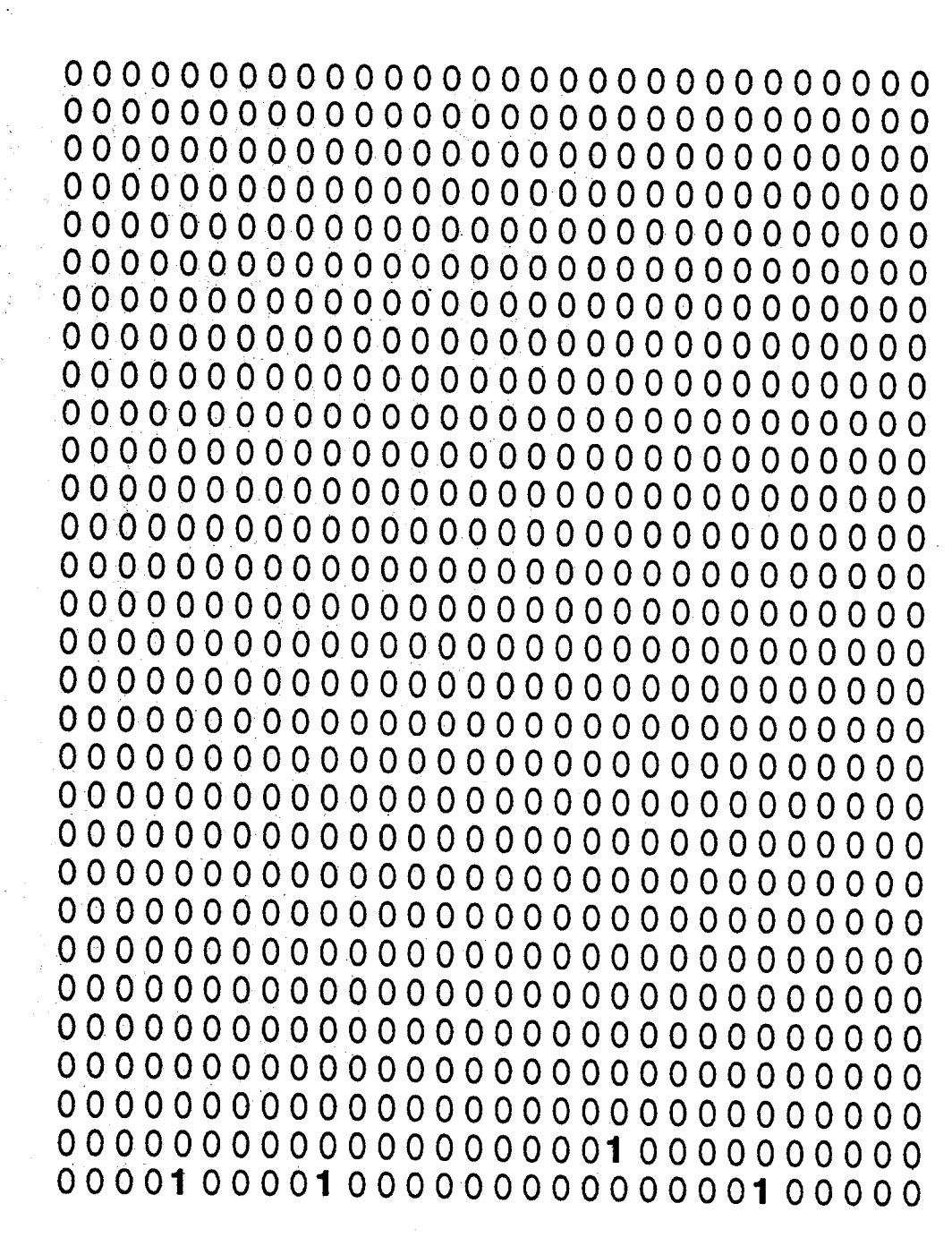

The next bit of information to be compressed is loaded into the last location of the array of FIG. 4D. The resulting array is shown in FIG. 4E. The data entered is a binary '0'. As such there is no change between the arrays of FIGS. 4D and 4E.

Figure 4F:
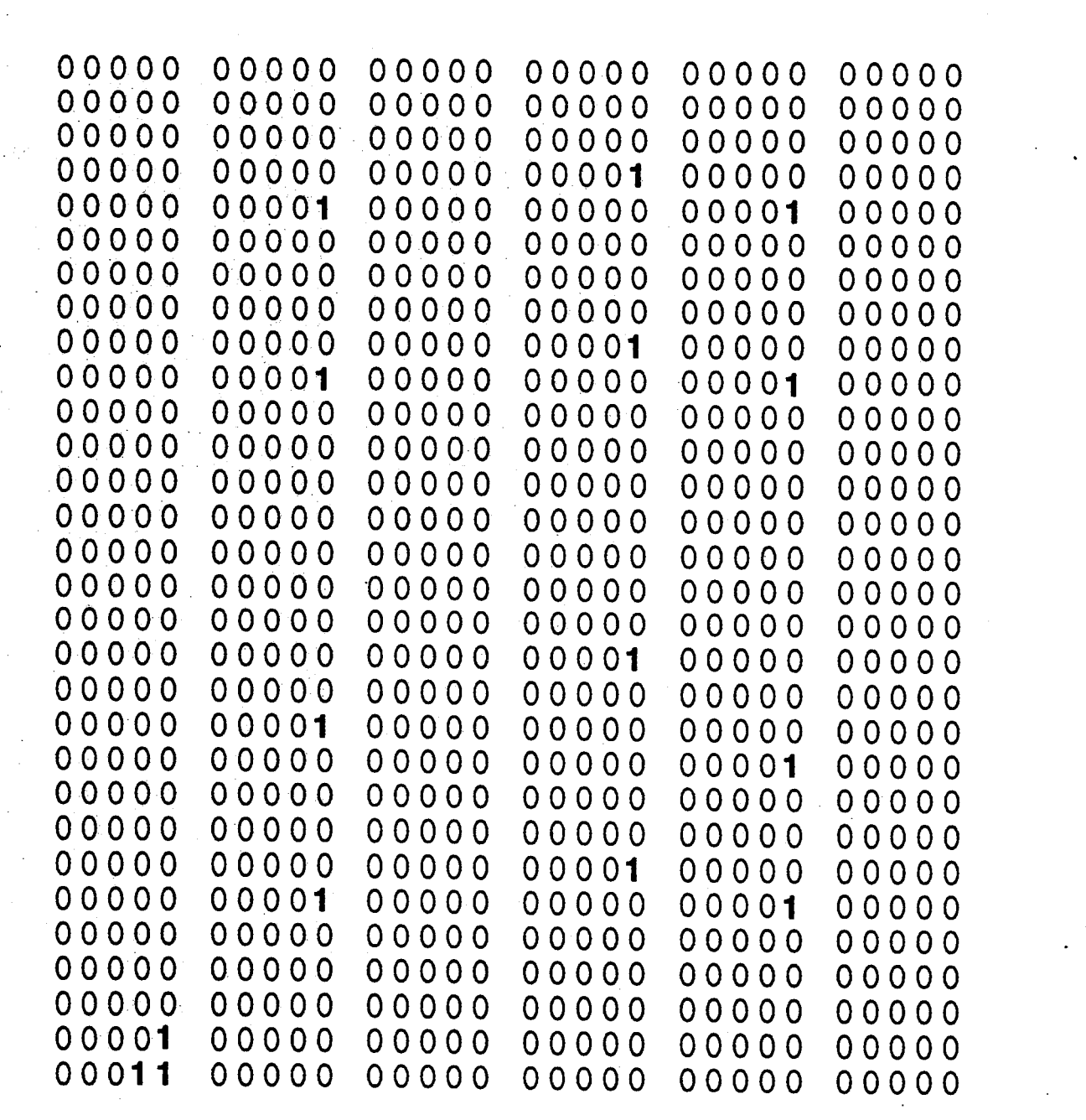

The summation of the binary 1's for each row, column and diagonal is formed and that information is stored into each appropriate morsel as shown in FIG. 4F. The array of FIG. 4G contains the identical information as the summation vector of FIG. 4F. Note that even though the data entered is a '0' the array has changed.

Figure 4G:
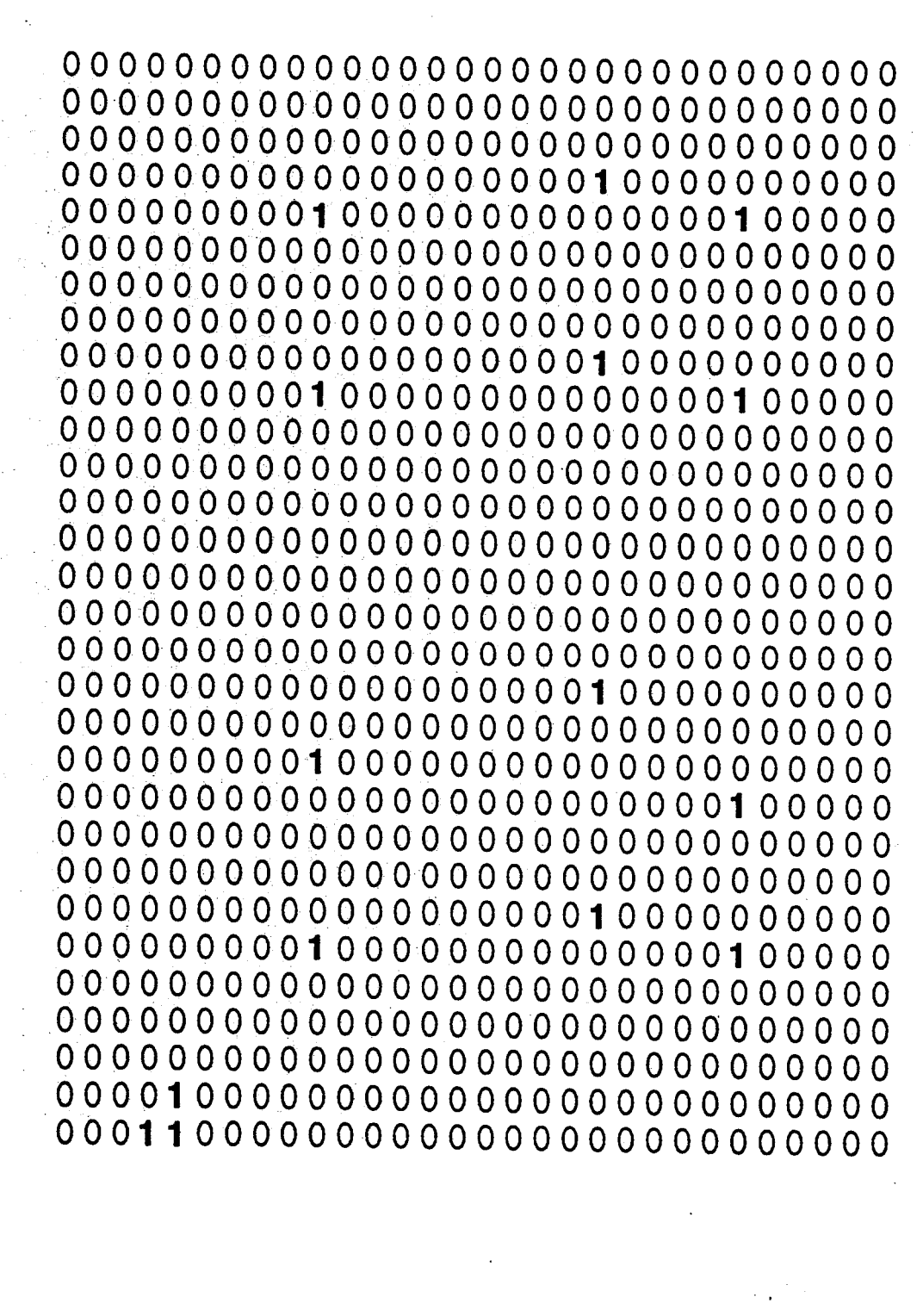
Figure 4H:
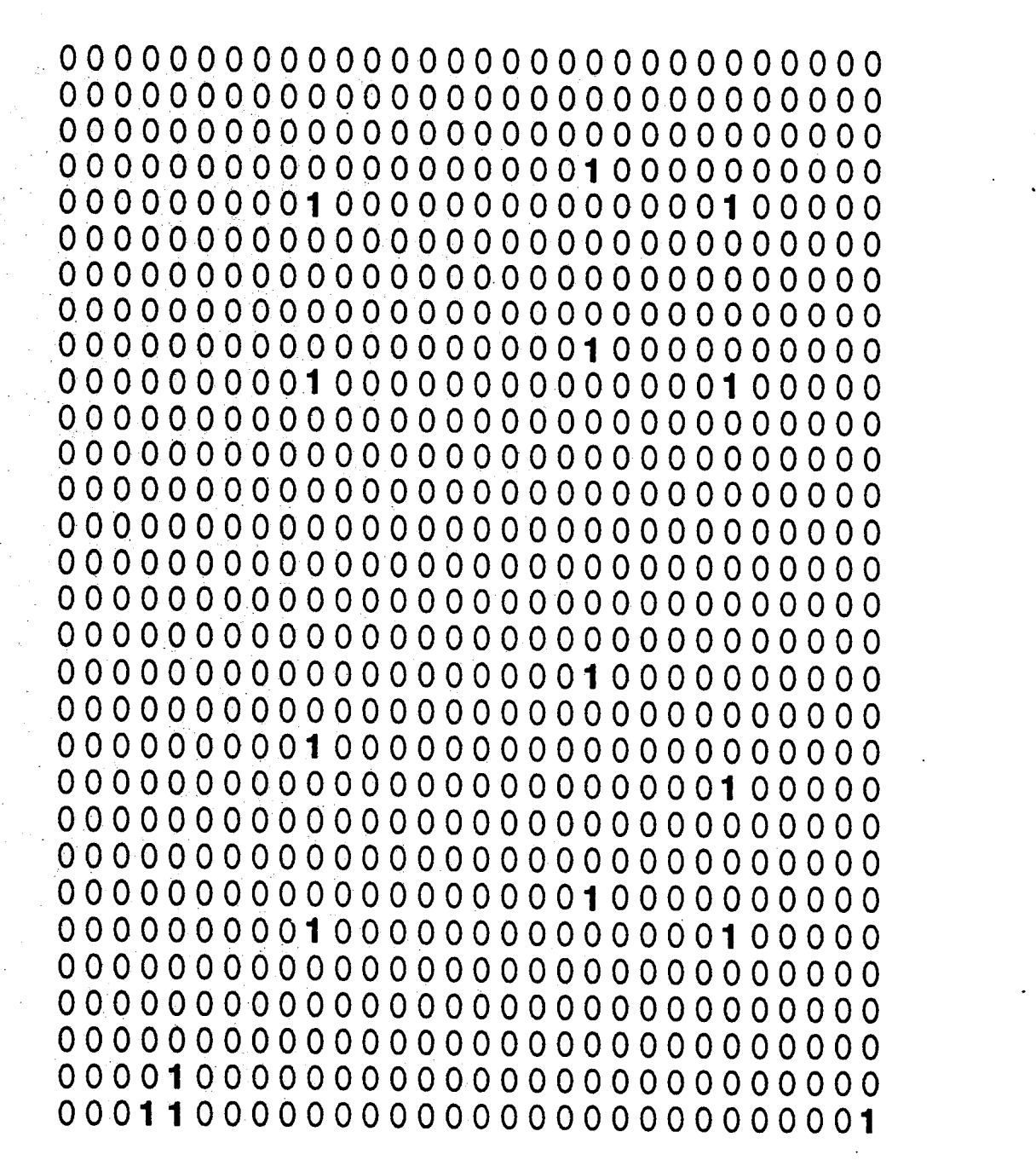
Figure 4I:
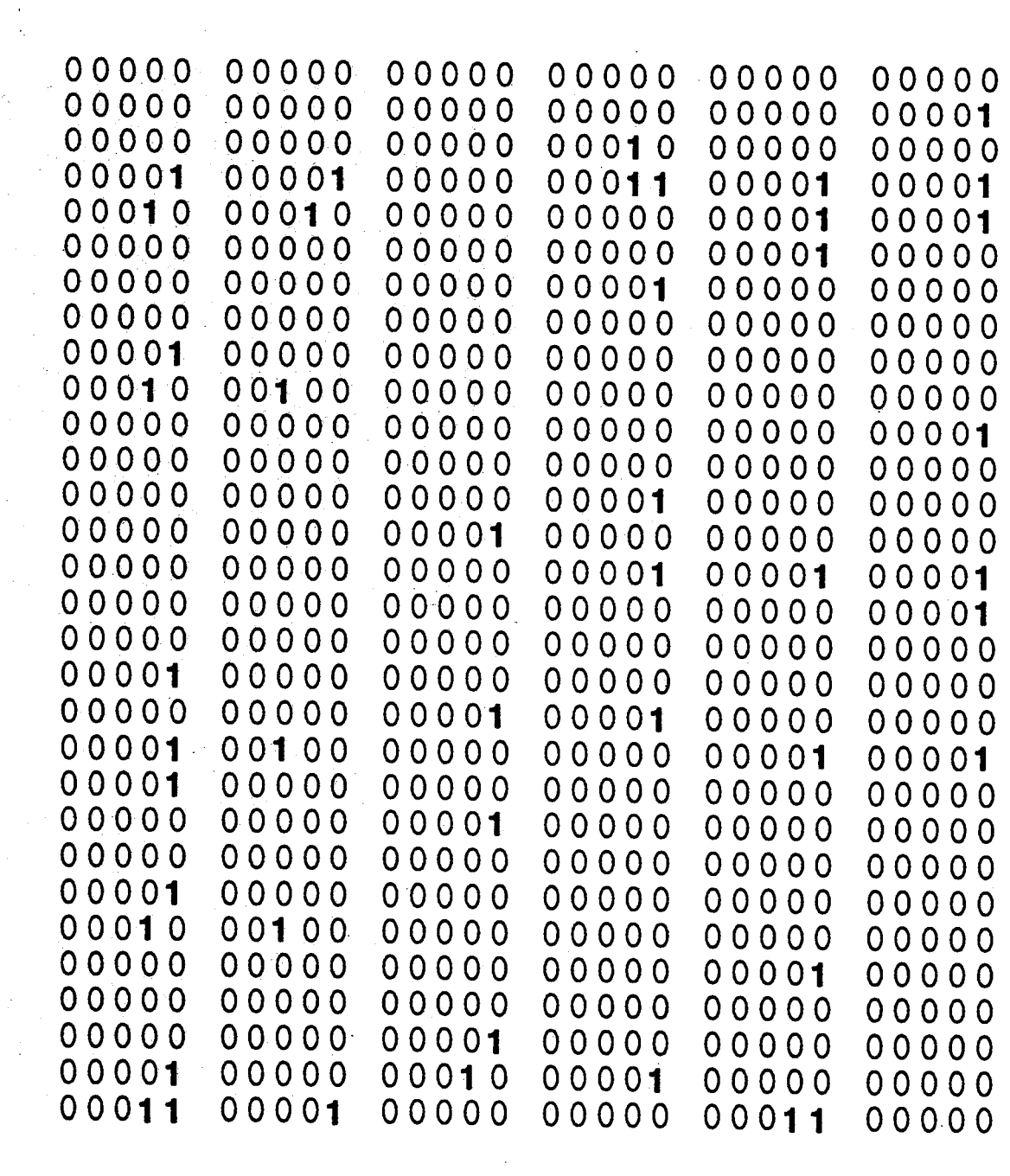
Figure 4J:
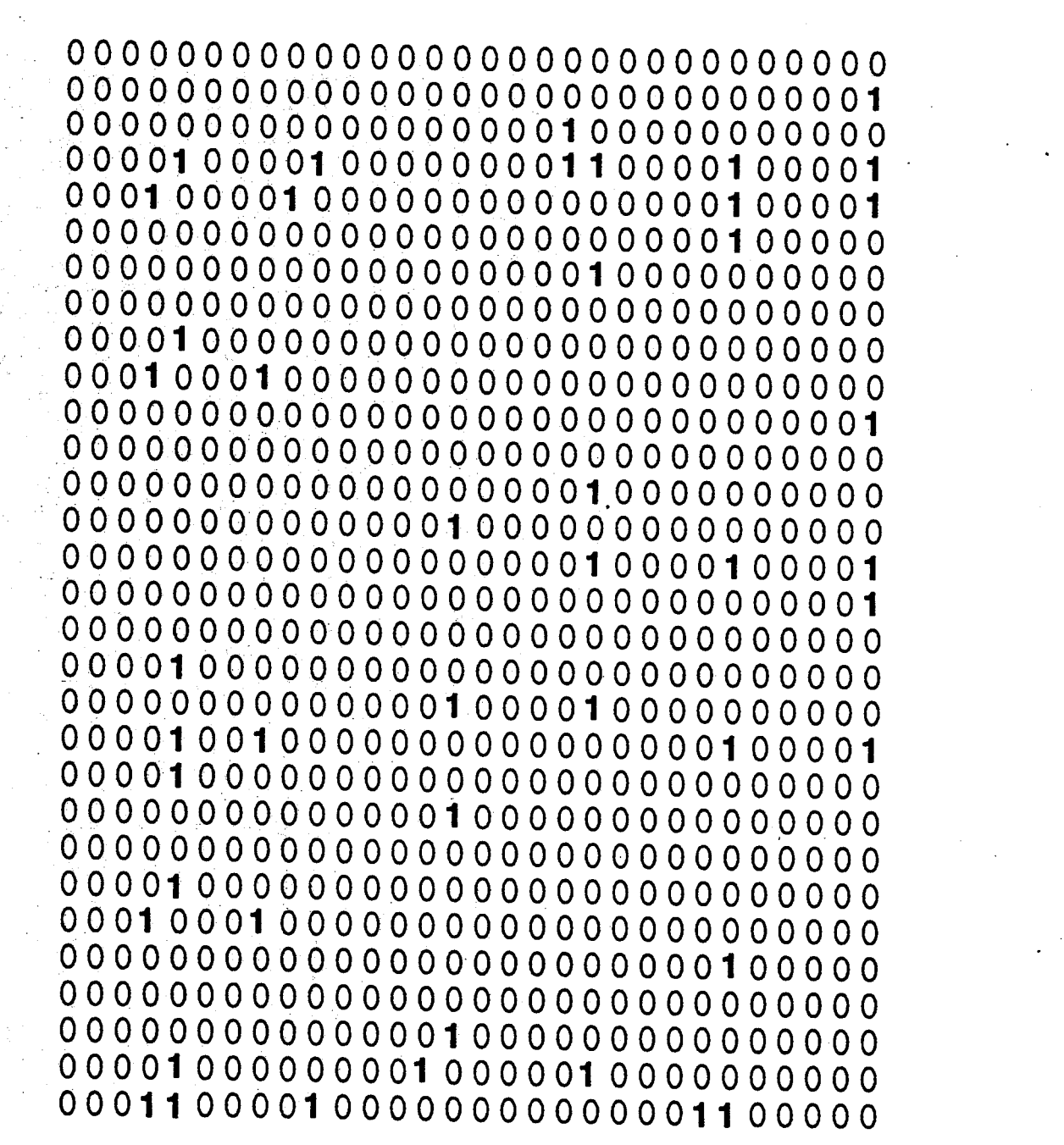

The next bit of information to be compressed is loaded into the last location of the array of FIG. 4G. The resulting array is shown in FIG. 4H. The data entered is a binary '1'. The summation of the binary 1's for each row, column and diagonal is formed and that information is stored into each appropriate morsel as shown in FIG. 4I. The resulting array is shown in FIG. 4J. When forming the next array after the new data is stored, the last morsel of columns 4 and 6 of the summation vector will always be all zero. These morsels correspond to left and right diagonals 60 which do not exist in a 30×30 array.

Figure 8:
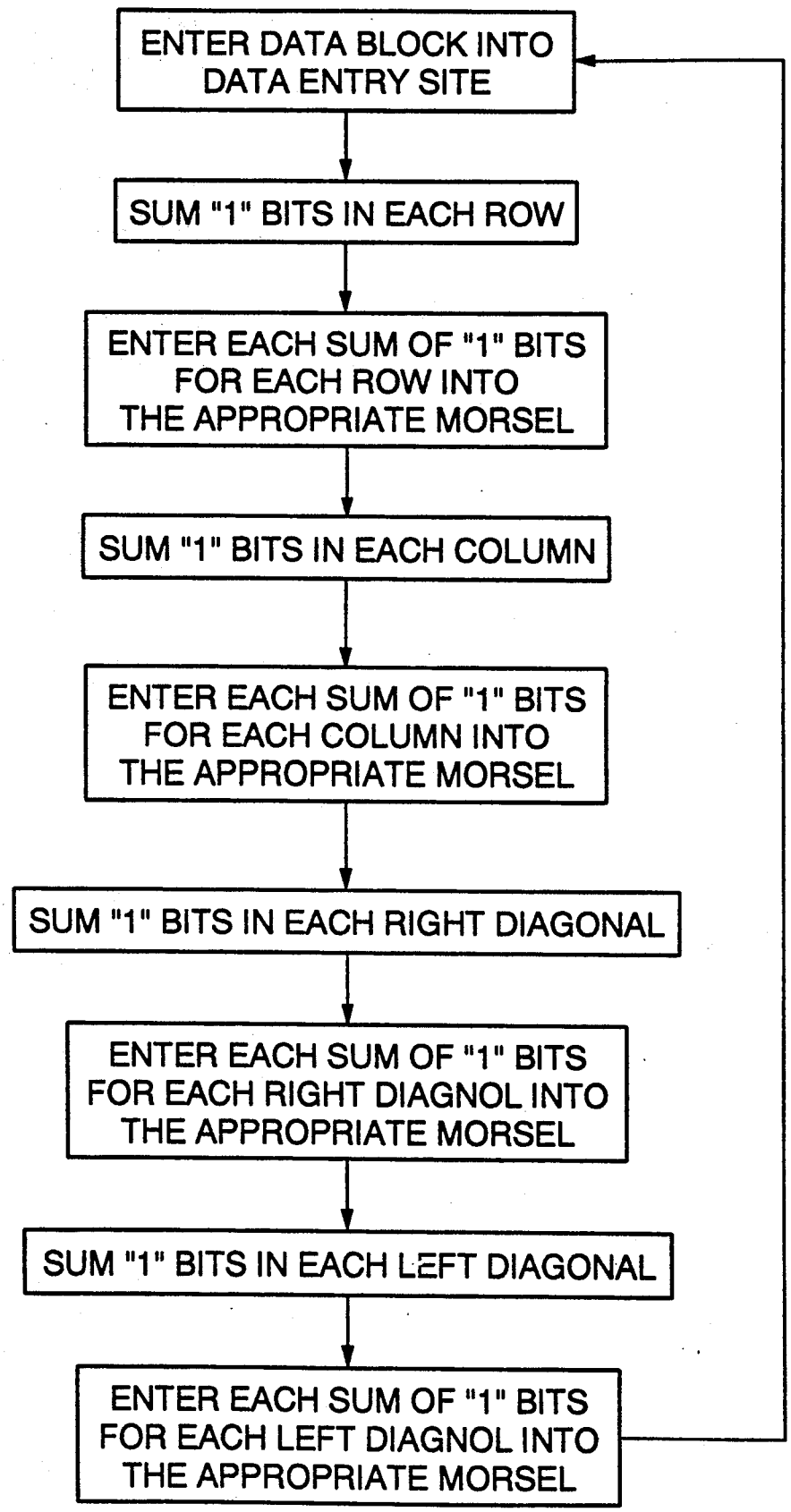
FIG. 8 shows a flow chart of the algorithm for compressing data according to the preferred embodiment of the present invention.

The data compression algorithm can be viewed as a flow chart as shown in FIG. 8. A data block is entered into the data entry site. Next, a sum of the binary '1' bits is calculated for each row. Then, each of the sum of binary '1' bits for each row is entered into the appropriate morsel in the array.

Next, a sum of the binary '1' bits is calculated for each column. Then, each of the sum of binary '1' bits for each column is entered into the appropriate morsel in the array. bits for each column is entered into the appropriate morsel in the array.

A sum of the binary '1' bits is calculated for each right diagonal. Each of the sum of binary 1 bits for each right diagonal is then entered into the appropriate morsel in the array.

Lastly, a sum of the binary '1' bits is calculated for each left diagonal. Then, each of the sum of binary '1' bits for each left diagonal is entered into the appropriate morsel in the array. The algorithm and array are now conditioned to enter a new data block into the data entry site.

The final array contains sufficient information to decompile the vector into its parent array. This is because the summation vector contains information related to the number of 1's in each row, each column, each left diagonal and each right diagonal. Accordingly, the array can be decompressed. During the decompression process, after the array is decompressed to its parent array, the last bit in the array, (30, 30), is extracted to reform the data stream. After the last bit in the array is extracted, that bit location is nulled to '0' in preparation for the decompression of the nest bit in the data stream. The bits extracted by the decompression method are retrieved in reverse sequence of compression, i.e. last in, first out know in the art as LIFO. When an all-zero array is resolved by decompression, all of the data in the array has been extracted and the decompressions complete.

First, a procedure called LOCK1 will be performed to achieve one member of a family of arrays which meet the criteria established by the information contained in the compressed array. A second procedure, call LOCK2, is then performed.

Figure 5A:
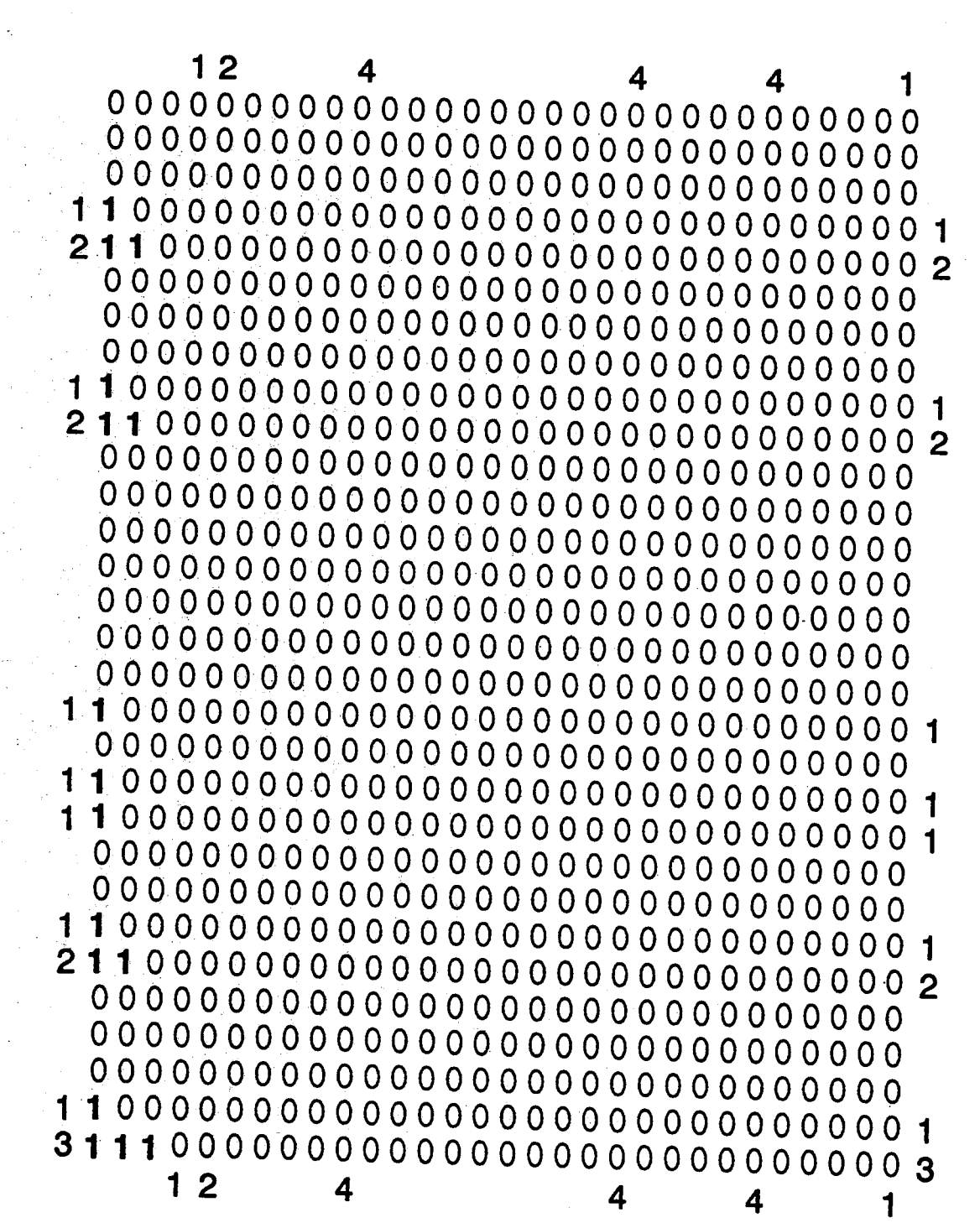

The technique to decompress the data stored in an array utilizes the information stored in each morsel. To facilitate understanding, the technique will be described while decompressing the stored data residing in the array of FIG. 4J. From the first column of morsels the number of binary 1's contained in each row is known. FIG. 5A shows an array representing the first step in decompressing the array of FIG. 4J. The appropriate number of 1's are entered at the left-hand end of each row. One constraint closure is achieved The number of 1's for each row and column is indicated outside of the array of FIG. 5A. To identify a specific element in an array the row number will be followed by the column number in parentheses.

After one constraint closure is achieved the algorithm proceeds to close the next constraint. LOCK1 occurs after all four constraints are closed. The four constraints are the number of 1's in the rows, columns, left diagonals and right diagonals. The algorithm is disclosed wherein each of these constraints is closed in a particular order. That order is not critical and may be performed in any convenient sequence.

Figure 5B:
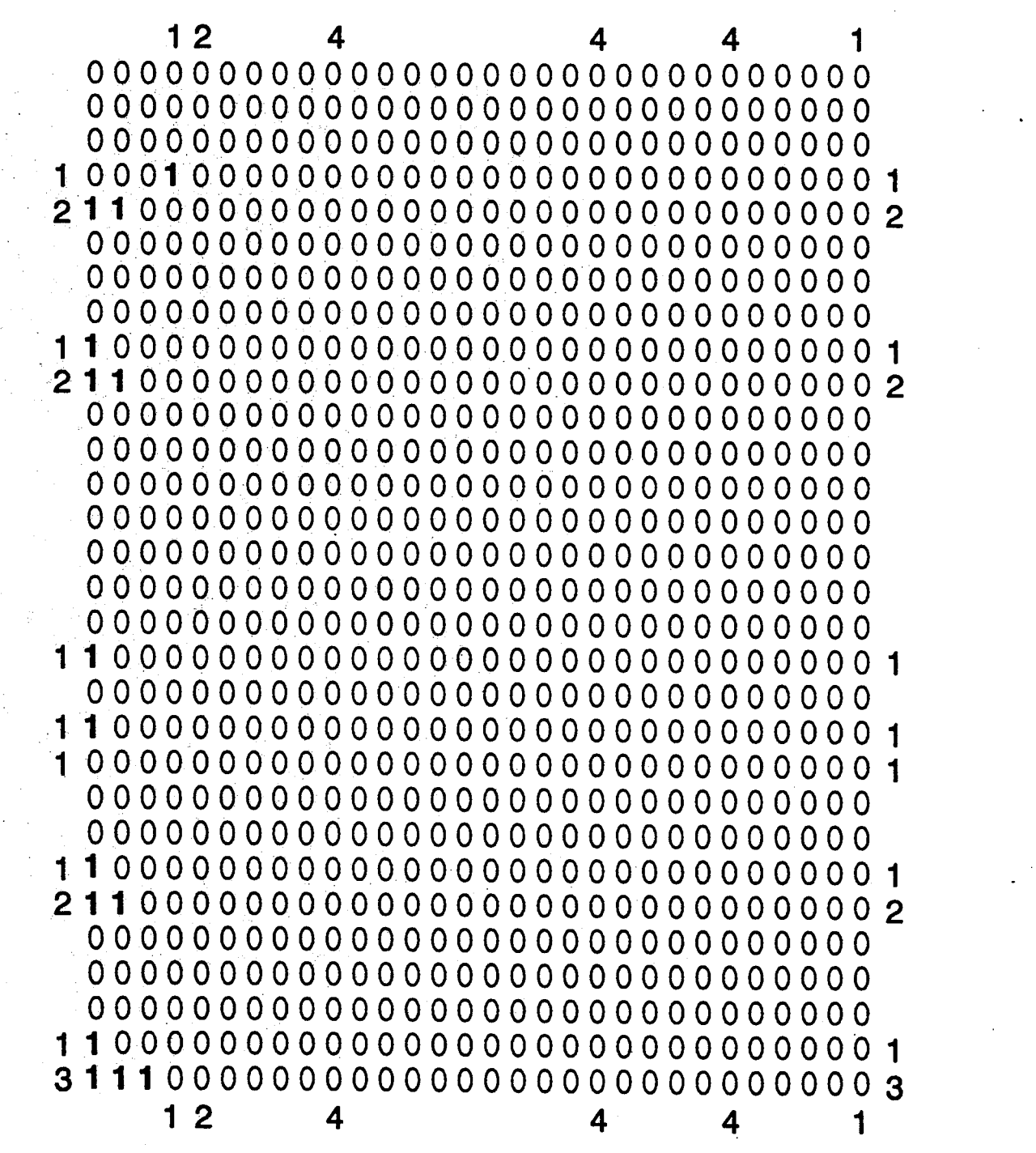

Beginning with the top row and proceeding through the array, each '1' which is found in a column having too many 1's is transposed with a zero in the same row from the nearest column to the right having too few 1's. Column 1 in FIG. 5A contains eleven 1's. There should be zero. There are no 1's in rows 1, 2 or 3. Row 4 contains a '1' in column 1. The nearest column to the right which requires a '1' is column 4 which contain no 1's but should have one. The '1' in (4,1) is transposed with the '0' at (4,4) resulting in the array of FIG. 5B. There are no more 1's in row 4.

Figure 5C:
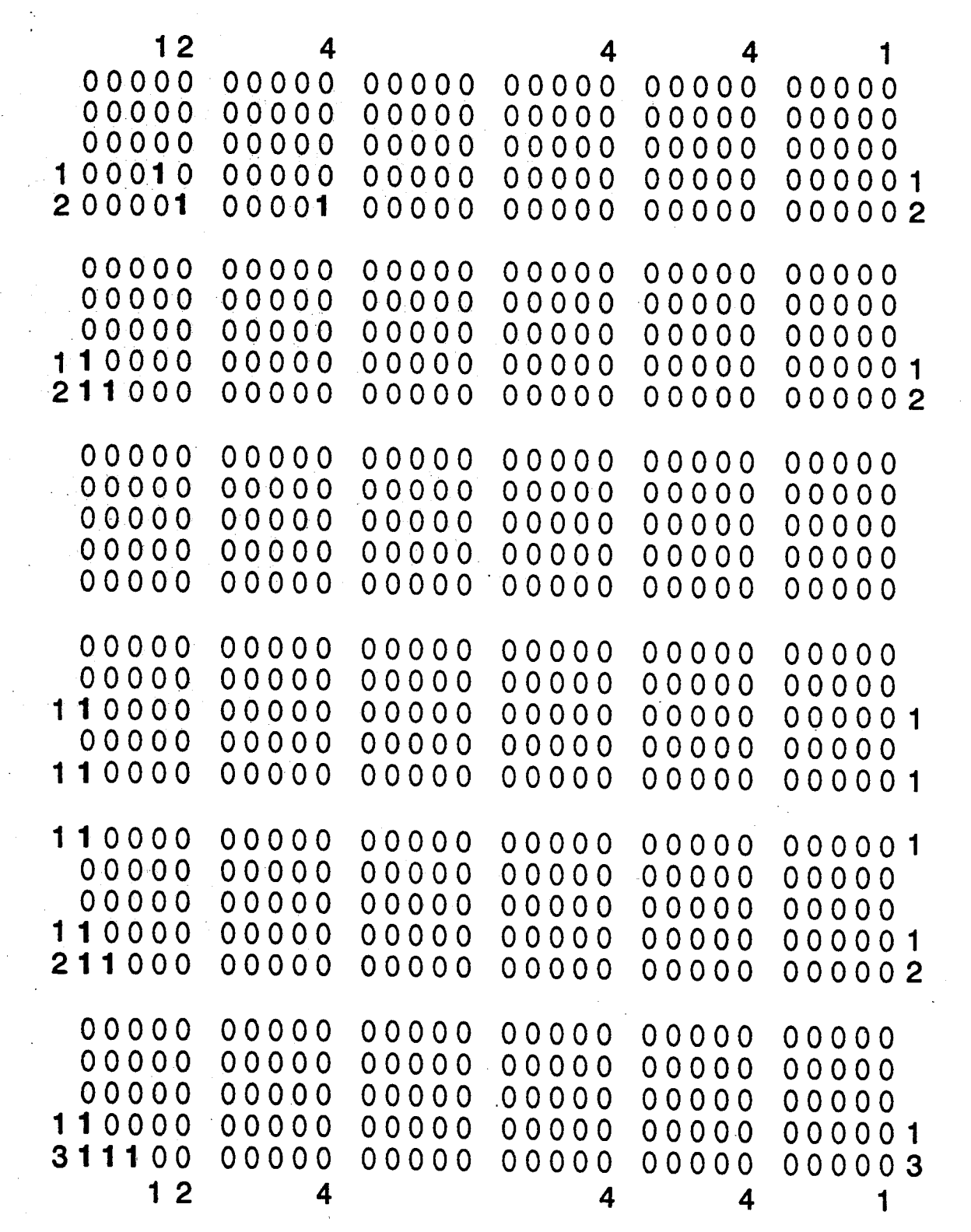

Row 5 contains two 1's. The '1' in (5,1) is in a column which needs zero 1's. The nearest column to the right needing a '1' is column 5. The '1' in (5,1) is transposed with the '0' in (5,5). Similarly, the '1' in (5,2) in transposed to (5,10) resulting in the array of FIG. 5C. Because these transpositions occur in the same row the integrity of the correct number of 1's in a row is not compromised.

Figure 5D:
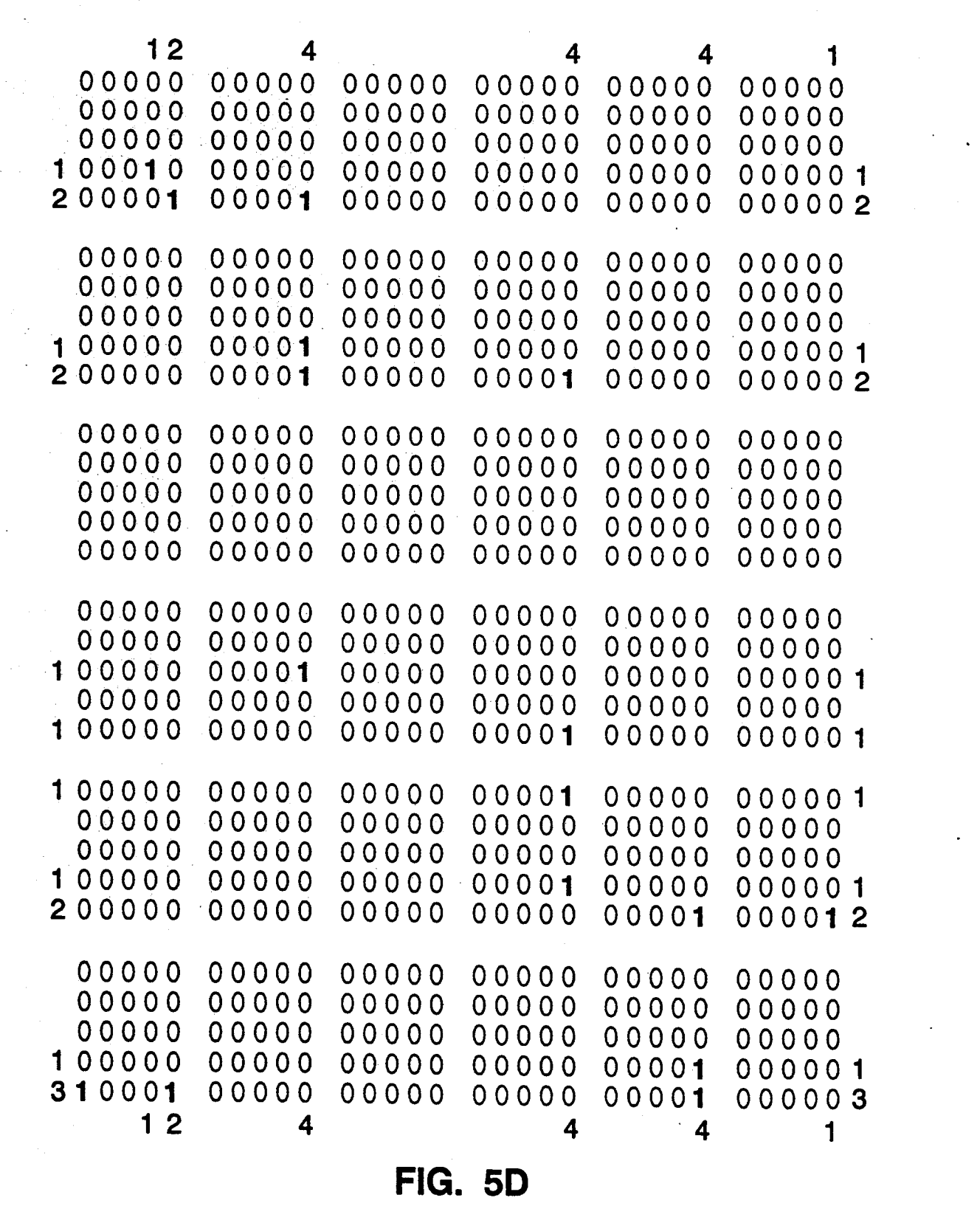
Figure 5E:
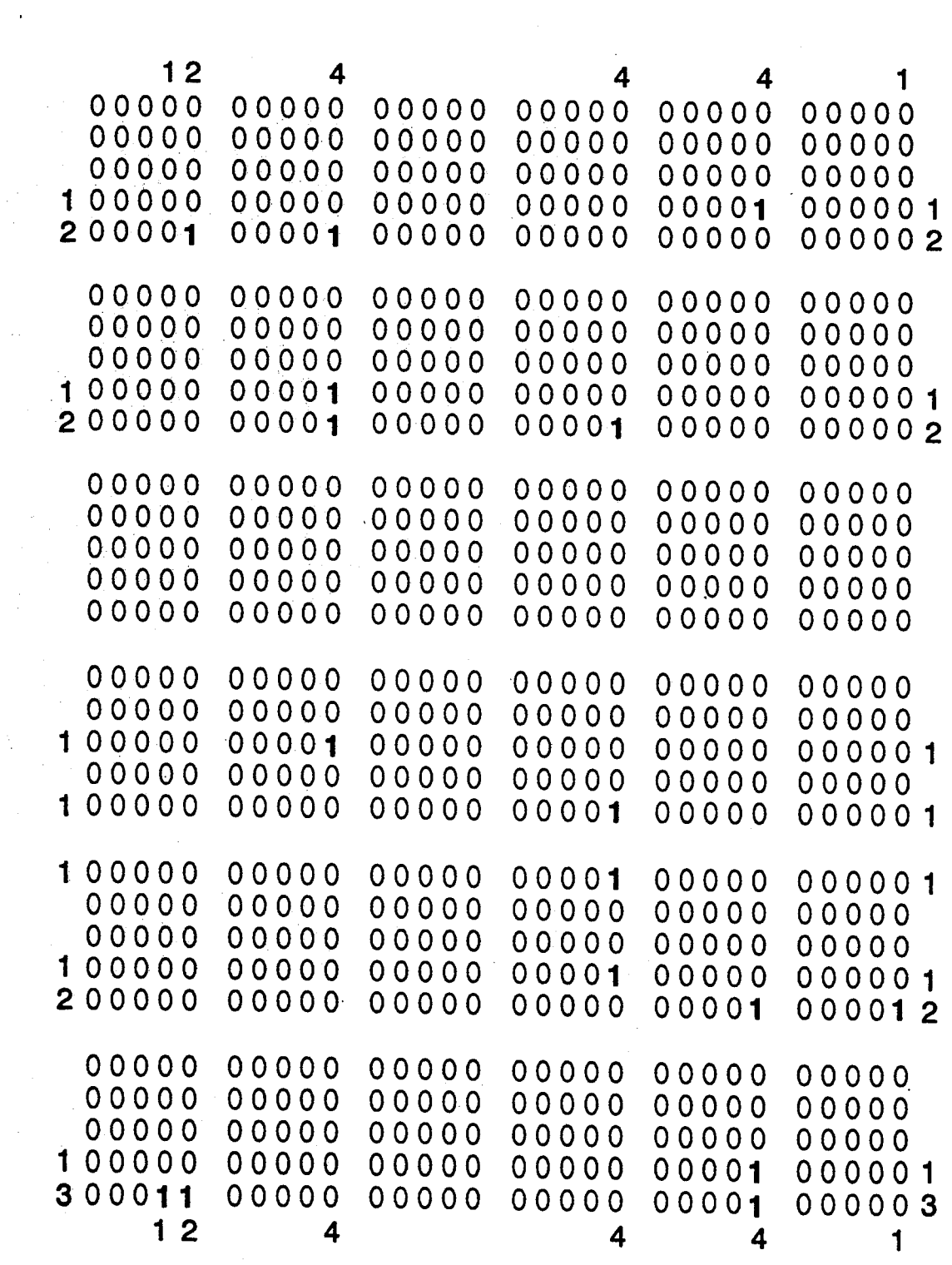

These transpositions are continued in this manner until the array of FIG. 5D is formed. The '1' in (30,3) cannot be transposed as described above. The only column needing an additional 1 is column 25 which needs four 1's but has only three. However, element (30,25) already contains a '1' and so transposing (30,3) does not solve this problem. The elements which remain are transposed into the nearest column to the right which contain 1's. Beginning at the top of this column an attempt is made to transpose each '1' in that column into a column which needs a '1' until there is a successful transposition. Should this fail, the procedure is repeated with the next nearest column. Here, (30,3):(30,4) (which means element (30,3) is transposed with element (30,4)) and (4,4):(4,20) resulting in the array of FIG. 5E. There are now the correct number of bits in each row and each column. This method is also called two bit transposition. Two constraint closure is achieved.

Next, the appropriate number of 1's are needed in each left diagonal. This achieved by rotating rectangles. A rectangle is a rectangle formed within an array by four elements whose two diagonals terminate one rectangle has corners of (4,10), (4,20), (5,10) and (5,20). Rotating the members of a rectangle by one location maintains the correct number of members in each row and each column. In a practical device the controlling computer will interchange the 1's and 0's in the corners of the rectangles. In this example, (4,10) is rotated into (4,20), (4,20) into (5,20), (5,20) into (5,10) and (5,10) into (4,10). The location of two opposite corners adequately defines a rectangle so this rectangle is written (4,10)/(5,20).

Figure 5F:
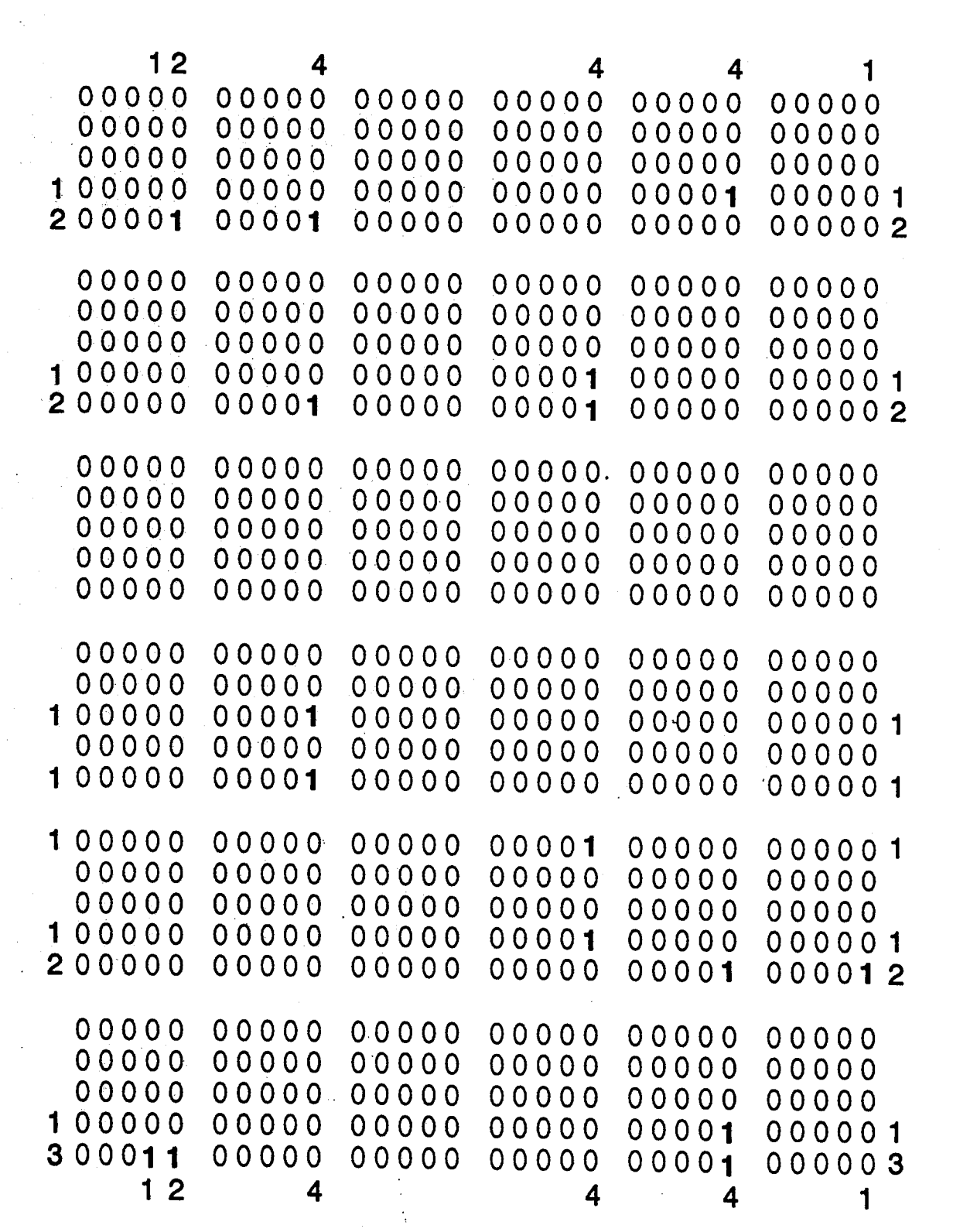

Once each rectangle is recognized it is rotated to determine whether the number of left diagonal discrepancies decreases or remains the same while the distance from the center decreases. If the number of discrepancies increases the rectangle is returned to its previous state. For example, the '1' in (5,5) is in the ninth left diagonal. The ninth left diagonal morsel in the array of FIG. 4J indicates that there should be zero 1's in the ninth left diagonal of the product array. By rotating the rectangle (9,10)/(20,20) an unwanted '1' in (9,10) of left diagonal 18 is eliminated, a second and needed '1' is rotated into (20,10) is added to left diagonal 29, an unwanted '1' in (20,20) is eliminated from left diagonal 39 and a second unneeded '1' is rotated into (9,20) of left diagonal 28. Three of the corners increase the number of discrepancies. The result of this rotation is an improvement of two discrepancies as shown in FIG. 5F. The rotation remains. After the rotation has been performed the rectangles for the array change. Additional rotations are continued as necessary until all left diagonal constraints are met. This method is also called a four bit transposition. Three constraint closure is achieved.

Occasionally, a stall condition exists while attempting to achieve three constraint closure. This occurs when no further rectangles exist that exhibit the proper attributes for performing a four bit transformation. In this case each synonym is rotated until an appropriate rectangle is found and the stall is corrected. A synonym is an equilateral octagon having alternating 1's and 0's in its corners. Any time a synonym is rotated the number of 1's in each row, column, left diagonal and right diagonal remains unchanged.

The method to close on the right diagonal constraints is similar to that for the left diagonal. The rectangles for the resulting array are identified. The rectangles are compared to identify pairs of rectangles having identical size and physical orientation by having oppositely oriented diagonals with 1's and 0's. These rectangles pairs are both rotated and the resulting array is inspected to determine whether the number of right diagonal discrepancies has increased, or decreased or remained the same with the discrepancies moving nearer to the center. If the number has increased then the rectangle pairs are rotated into their previous state, otherwise the rotation remains. Additional pair rotations are performed as necessary until all right diagonal constraints are met. This method is also called eight bit transposition. Four constraint closure is achieved.

Occasionally, a stall condition exists while attempting to achieve four constraint closure. However, randomly rotating synonyms does not work as it did for a three constraint closure stall. Here, the synonyms which are rotated must be part of a rectangle pair having also alternating 1's and 0's.

Figure 6:
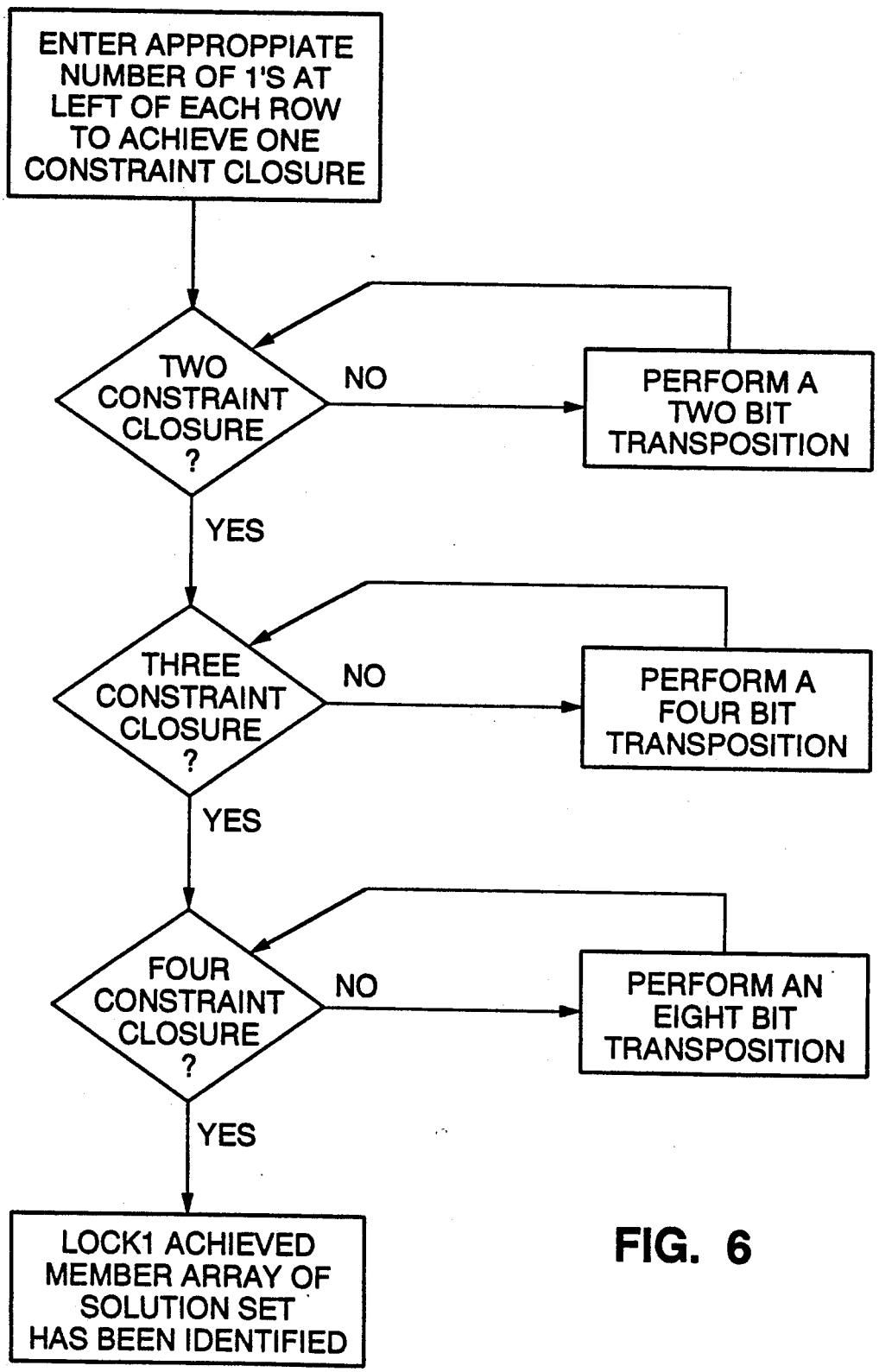
FIG. 6 shows a flow chart of the procedure for achieving LOCK1.

FIG. 6 shows a block diagram for achieving LOCK1 according to the preferred embodiment. As described above, the appropriate number of 1's are entered by the controlling computer into each row of memory according to information contained in each corresponding morsel. This achieves one constraint closure.

The resulting array is inspected by the computer to determine whether two constraint closure is achieved. If not, the computer performs a two bit transposition and then inspects the new array. This procedure is repeated until two constraint closure is achieved.

The resulting array is inspected by the computer to determine whether three constraint closure is achieved. If not, the computer performs a four bit transposition and then inspects the new array. This procedure is repeated until three constraint closure is achieved.

The resulting array is inspected by the computer to determine whether four constraint closure is achieved. If not, the computer performs a eight bit transposition and then inspects the new array. This procedure is repeated until four constraint closure is achieved. Once four constraint closure is achieved, LOCK1 is completed.

The above decompression method is called LOCK1. An array satisfying each constraint in the descendent summation vector has been formed. This array is a member of a family of arrays each of which satisfies LOCK1 for the descendent summation vector. Each member is found by rotating synonyms as described below. To determine which is the correct parent member of this family of arrays from which the descendent array was formed, a second procedure, LOCK2, is performed on this target array.

A synonym is an equilateral octagon with alternating 1's and 0's in the either corners. The octagon can be any size which fits within the array.

In the method of LOCK2 the parent array and each of its synonym arrays is identified as a member of the solution set. Each synonym is rotated, i.e. the corner 1's and 0's are transposed to form a test array. Rotating a synonym finds a new member array. Each member has four constraint closure over the descendent summation vector. LOCK1 is performed on each member array. A successful LOCK1 result will be achieved for only the correct parent array. It will not be possible to complete the LOCK1 procedure on spurious member arrays. In this way final closure is achieved. After the parent array is found, the last bit in the array, (30, 30) is extracted and then the last bit is nulled in preparation for the next LOCK1 procedure.

Figure 7:
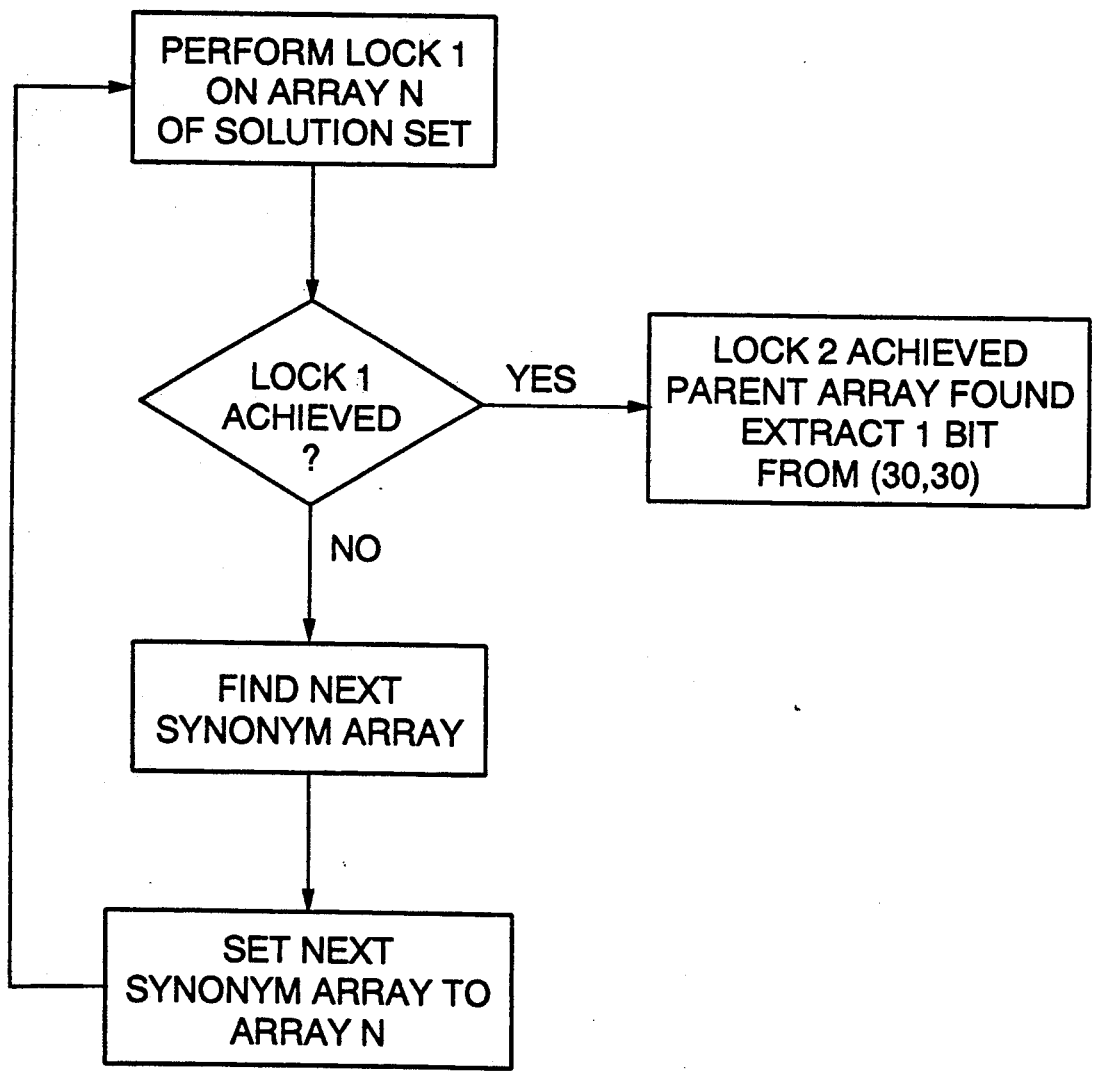
FIG. 7 shows a flow chart of the procedure for achieving LOCK2.

FIG. 7 shows a flow chart for the LOCK2 procedure according to the preferred embodiment. As described above LOCK1 resolves a member array in a solution set of arrays. Only one member in that set is the parent array of the descendent array. Because, LOCK1 is only successful on the parent array, LOCK1 is performed on the resolved member array N. If the attempt at LOCK1 is unsuccessful the next synonym array is found by rotating the synonym octagon. LOCK1 is attempted on that array. This procedure is repeated until a successful LOCK1 occurs. The data bit (30,30) is extracted from the parent array.

What is claimed is:
1. An algorithmic method for compressing data one cycle at a time for storing data blocks for each said cycle into an array of binary bits having (1) a first plurality of rows; (2) a second plurality of columns; (3) a third plurality of right diagonals; (4) a fourth plurality of left diagonals; (5) a fifth plurality of morsels, each said morsel comprising a unique collection of binary bits; and (6) a data entry site comprising one of the morsels, the method comprising the steps of:
   a. entering a new data block into the data entry site;
   b. forming a first plurality of sums representing the sums of binary 1's in each row wherein at least one of the rows includes the data entry site;
   c. forming a second plurality of sums representing the sums of binary 1's in each column wherein at least one of the columns includes the data entry site;
   d. forming a third plurality of binary 1's in each right diagonal wherein at least one of the right diagonals includes the data entry site;
   e. forming a fourth plurality of sums representing the sums of binary 1's in each left diagonal wherein at least one of the left diagonals includes the data entry site; and
   f. storing each of the sums into an appropriate one of the fifth plurality of morsels excepting the data entry site so that a first plurality of the morsels each represents one of the sums of binary 1's in each row, a second plurality of the morsels each represents one of the sums of binary 1's in each column, a third plurality of the morsels each represents one of the sums of binary 1's in each right diagonal and a fourth plurality of the morsels each represents one of the sums of binary 1's in each left diagonal, thereby forming a compressed array.

2. The method according to claim 1 wherein the array contains 30 rows, and 30 columns, 59 left diagonals and 59 right diagonal.

3. The method according to claim 1 wherein the data entry site comprises a single bit location.

4. The method according to claim 1 wherein each morsel contains 5 bits.

5. The method according to claim 4 further comprising two blank morsels, wherein a summation vector having the same dimensions as the array is formed by bringing together all of the summation morsels and the two blank morsels.

6. The method according to claim 5 wherein the data entry site is within one of the blank morsels.

7. The method according to claim 1 further comprising a method for extracting the data one cycle at a time from the compressed array comprising the steps of:
   a. placing an appropriate number of bits into each row to achieve one constraint closure;
   b. performing two bit transpositions within each row to achieve two constraint closure comprising the step of interchanging a one bit in a column having too many 1's with a zero bit in a column having too few 1's.;
   c. performing four bit transpositions to achieve three constraint closure comprising the steps of:
      1) identifying each single rectangle within the compressed array having 1's in opposite corners and 0's in the other corners; and
      2) interchanging the 1's in the corners of the single rectangle with the 0's.;
   d. performing eight bit transpositions to achieve four constraint closure comprising the steps of:
      1) identifying pairs of identically sized paired rectangles within the compressed array having 1's in opposite corners and 0's in the other corners wherein the two paired rectangles of the pair are mirror images of each other; and
      2) interchanging the 1's in the corners of the paired rectangles with the 0's.; and
   e. performing octagon rotations to achieve final closure comprising the steps of:
      1) identifying equilateral octagons within the compressed array having alternating 1's and 0's in its corners; and
      2) interchanging the 1's in the corners of the octagon with the 0's.

8. An algorithmic method for decompressing data from a compressed array comprising the steps of:
   a. placing an appropriate number of bits into each row to achieve one constraint closure;
   b. performing two bit transpositions within each row to achieve two constraint closure comprising the step of interchanging a one bit in a column having too many 1's with a zero bit in a column having too few 1's;
   c. performing four bit transpositions to achieve three constraint closure comprising the steps of:

1) identifying each single rectangle within the compressed array having 1's in opposite corners and 0's in the other corners; and
2) interchanging the 1's in the corners of the single rectangle with the 0's.;
d. performing eight bit transpositions to achieve four constraint closure comprising the steps of:
1) identifying pairs of identically sized pair rectangles within the compressed array having 1's in opposite corners and 0's in the other corners wherein the two paired rectangles of the pair are mirror images of each other; and
2) interchanging the 1's in the corners of the paired rectangles with the 0's.; and
e. performing octagon rotations to achieve final closure comprising the steps of:
1) identifying equilateral octagons within the compressed array having alternating 1's and 0's in its corners; and
2) interchanging the 1's in the corners of the octagon with the 0's.

* * * * *